US010374651B1

(12) United States Patent
Sivakumar et al.

(10) Patent No.: US 10,374,651 B1
(45) Date of Patent: Aug. 6, 2019

(54) SYSTEMS AND METHODS OF RELOCKING FOR LOCKED LOOPS

(71) Applicant: Qualcomm Incorporated, San Diego, CA (US)

(72) Inventors: Shyam Sundar Sivakumar, Mountain View, CA (US); Kevin Jia-Nong Wang, Poway, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/147,658

(22) Filed: Sep. 29, 2018

(51) Int. Cl.
| | |
|---|---|
| H03L 7/00 | (2006.01) |
| H03L 7/093 | (2006.01) |
| H04B 1/403 | (2015.01) |
| H03L 7/107 | (2006.01) |
| H04B 1/00 | (2006.01) |

(52) U.S. Cl.
CPC .............. H04B 1/403 (2013.01); H03L 7/093 (2013.01); H03L 7/1075 (2013.01); H04B 1/006 (2013.01)

(58) Field of Classification Search
CPC ..... H03L 7/0812; H03L 7/0814; H03L 7/095; H03L 7/101; H03L 7/102; H03L 7/103; H03L 7/104
USPC ............... 327/156, 159; 331/1 A, 17, 40, 41
See application file for complete search history.

(56) References Cited

U.S. PATENT DOCUMENTS

| | | | |
|---|---|---|---|
| 5,890,051 A | 3/1999 | Schlang et al. | |
| 7,224,948 B1 | 5/2007 | Yamawaki et al. | |
| 7,242,229 B1 * | 7/2007 | Starr | H03L 7/081 327/115 |
| 7,646,223 B2 | 1/2010 | Kim et al. | |
| 7,714,625 B2 | 5/2010 | Chatterjee et al. | |
| 8,279,014 B2 | 10/2012 | Chen et al. | |
| 8,595,518 B2 * | 11/2013 | Kii | G06F 1/3203 713/300 |
| 8,643,414 B1 | 2/2014 | Navid | |
| 8,760,202 B1 | 6/2014 | Sinha et al. | |
| 9,602,113 B2 * | 3/2017 | Galton | H03L 7/093 |
| 9,762,220 B2 | 9/2017 | Han et al. | |

OTHER PUBLICATIONS

Lee, et al., "A 1.0-ns/1.0-V Delay-Locked Loop With Racing Mode and Countered CAS Latency Controller for DRAM Interfaces", IEEE Journal of Solid-State Circuits; Year: 2012; vol. 47, No. 6, pp. 1436-1447., Jun. 2012, 12 pages.

(Continued)

Primary Examiner — An T Luu
(74) Attorney, Agent, or Firm — Colby Nipper/Qualcomm

(57) ABSTRACT

An apparatus is disclosed for relocking of a locked loop. In an example aspect, the apparatus includes a locked loop, and the locked loop includes a loop and a locked-loop controller that is coupled to the loop. The loop is configured to run responsive to a run signal. The loop includes a memory state component and signal characteristic adjustment circuitry coupled to the memory state component. The signal characteristic adjustment circuitry is configured to produce an output signal having a characteristic that is based on the memory state component. The locked-loop controller is configured to receive an external power mode signal (EPMS). The locked-loop controller is also configured to generate the run signal to have an enable value at a first time when the EPMS is indicative of an external normal mode and at a second time when the EPMS is indicative of an external standby mode.

30 Claims, 12 Drawing Sheets

OTHER PUBLICATIONS

Skolota, et al., "Development Synthesizer of Stable High-Frequency Signal", Micro/Nanotechnologies and Electron Devices (EDM), 2016 17th International Conference of Young Specialists on. IEEE, 2016, 2016, 6 pages.

* cited by examiner

SYSTEMS AND METHODS OF RELOCKING FOR LOCKED LOOPS

TECHNICAL FIELD

This disclosure relates generally to electronic devices as well as the integrated circuits thereof and, more specifically, to facilitating the use of locked loops with communication signaling by utilizing systems and method for relocking such locked loops.

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants, thermostats, automotive electronics, robotics, devices embedded in other machines like refrigerators and industrial tools, Internet-of-Things (IoT) devices, and the like. These various electronic devices provide information, entertainment, social interaction, security, safety, productivity, transportation, and other services to human users. Thus, electronic devices play crucial roles in many aspects of modern society.

Many of the services provided by electronic devices in today's interconnected world depend at least partly on electronic communications. Electronic communications can include those exchanged between or among distributed electronic devices using wireless or wired signals that are transmitted over one or more networks, such as the Internet or a cellular network. Electronic communications can also include those exchanged between or among different printed circuit boards, modules, chips, or even cores of a given integrated circuit that are within a single electronic device. Regardless, electronic communications are usually accomplished by generating or propagating signals. Such electronic communications are typically performed using at least one signal that is designed to have a specified characteristic, such as a particular frequency. Generally, communication signals are more likely to be correctly transmitted and received, as well as properly interpreted, if the specified signal characteristic is accurately created and reliably maintained.

With regard to a frequency signal characteristic, a phase locked loop (PLL) can be used to create, or synthesize, a desired frequency. In fact, a PLL is a core part of many frequency synthesizers. A frequency synthesizer is a component that is employed by electronic devices to synthesize signals having different frequencies. In operation, a PLL receives a reference signal and applies the reference signal to a feedback loop. Using the feedback loop, the circuitry of the PLL generates an output signal that oscillates at a desired frequency in a stable and accurate manner based on the reference signal. Typically, the PLL derives the frequency of the oscillating output signal from the reference signal, such as by generating an output frequency that is some multiple of a frequency of the reference signal.

A PLL-based frequency synthesizer thus outputs an oscillating signal having some desired frequency. The electronic device then uses the synthesized frequency of the oscillating output signal in one or more stages of a communication scenario. Example stages for communicating an electromagnetic signal include generating, transmitting, receiving, or interpreting a communication signal. In an example signal-generation stage, a frequency generated by a PLL can be used to modulate a communication signal. Here, the modulation entails encoding or adding information to the communication signal. In an example signal-transmission stage, the frequency generated by a PLL can be employed to upconvert a frequency of a communication signal using a mixer. With an up-conversion operation, the mixer increases the frequency of the communication signal, such as to enable the communication signal to be transmitted wirelessly as a radio frequency (RF) signal between a smartphone and a cellular base station.

A PLL can also be used with the stages of a reception side of a typical communication scenario. For instance, a PLL can be used to down-convert a frequency of a received communication signal or to demodulate the received communication signal to recover the encoded information. Additionally, a PLL can be used to produce a clock signal that controls a rate of operation of circuitry on an integrated circuit, such as a system-on-chip (SoC) that processes a communication signal or a graphics chip that processes video data that is being displayed to an end user.

Thus, PLLs are employed in multiple stages of a communication scenario to support electronic communication with electronic devices. Other types of locked loops, such as frequency locked loops (FLLs) and delay locked loops (DLLs), are also instrumental in the proper functioning of electronic devices. Consequently, electrical engineers and other designers of electronic devices strive to improve the functionality and usability of locked loops to facilitate electronic communication with electronic devices.

SUMMARY

Systems and methods of relocking for locked loops are disclosed herein. In some implementations, internal power modes for a locked loop are at least partially decoupled from external power modes. If an external standby mode is in effect, a locked loop can nevertheless spin up a loop to lock the loop during the external standby mode. A locked-loop controller repetitively spins up the loop to attain a locked state as part of an internal run mode that overrides the external standby mode before returning to an internal pause mode that at least partially adheres to the external standby mode. This repeated running of the loop keeps the loop warm so that the loop can more quickly relock and thus be restarted for further processing after the external standby mode ends. This can reduce latency coming out of a low-power mode to better balance power consumption versus performance with the disclosed locked loops.

An apparatus having a locked loop is disclosed herein. Example implementations of the disclosed locked loop include a loop and a locked-loop controller that is coupled to the loop. The loop is configured to run responsive to a run signal. The loop includes a memory state component and signal characteristic adjustment circuitry coupled to the memory state component. The signal characteristic adjustment circuitry is configured to produce an output signal having a characteristic that is based on the memory state component. The locked-loop controller is configured to receive an external power mode signal. The locked-loop controller is also configured to generate the run signal to have an enable value at a first time when the external power mode signal is indicative of an external normal mode and generate the run signal to have the enable value at a second time when the external power mode signal is indicative of an external standby mode.

In an example aspect, a system is disclosed that includes a locked loop. The locked loop includes a loop configured to provide an output signal responsive to a run signal. The locked loop also includes control means for periodically keeping the loop warm responsive to an external power mode signal being indicative of an external standby mode, the control means configured to provide the run signal to the loop.

In an example aspect, a method for operating a locked loop is disclosed. The method includes receiving an external power mode signal. Responsive to the external power mode signal being indicative of an external normal mode, the method also includes enabling a loop of the locked loop to run to lock an output signal of the locked loop to a reference signal. Responsive to the external power mode signal being indicative of an external standby mode, the method additionally includes disabling the loop of the locked loop from running and enabling the loop to run toward locking of the output signal to the reference signal.

BRIEF DESCRIPTION OF DRAWINGS

FIG. 2-1 illustrates a reference signal source and an example locked loop that includes both a loop and a locked-loop controller with which relocking for locked loops can be implemented.

FIG. 2-2 illustrates an example device environment to implement systems and methods of relocking for locked loops.

FIGS. 5-1 to 5-4 illustrate different example operational states of a locked loop as an external power mode signal and an internal power mode signal vary over time to implement relocking for locked loops.

DETAILED DESCRIPTION

Figure 1:
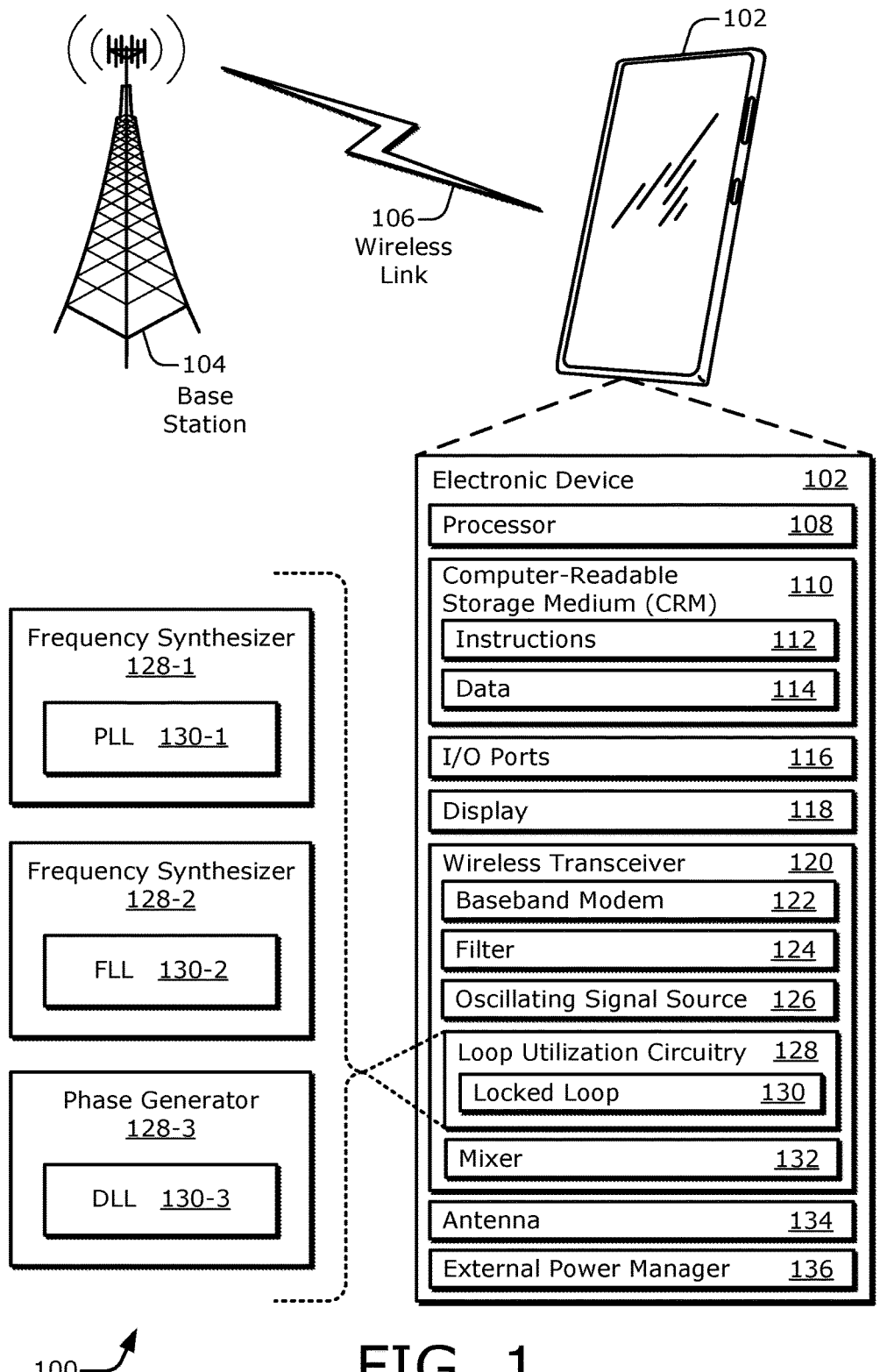
FIG. 1 illustrates an example environment that includes an electronic device in which systems and methods of relocking for locked loops can be implemented.

Generally, electronic communications are made using signals that oscillate at different frequencies. Electronic devices use components such as frequency synthesizers and phase generators to create signals having different frequencies or other signal characteristics. To do so, a feedback-based locked loop is employed to produce a signal having a desired characteristic to facilitate electronic communications. In addition to enabling communication signaling, these locked loops are often used to generate clock signals that control the timing of processing operations in integrated circuits, such as a central processor unit (CPU), a graphics processing unit (GPU), or a system-on-chip (SoC).

Electronic devices use oscillating signals that rise and fall at some frequency or with some phase, or that otherwise occur in accordance with some timing parameter. For example, electronic devices use oscillating signals to control a rate of operation (e.g., with a clock signal) or to facilitate the transmission and reception of signals (e.g., with mixers that perform frequency conversions). These various oscillating signals can be generated using some type of locked loop. Examples of different types of locked loops include a phase locked loop (PLL), a frequency locked loop (FLL), and a delay locked loop (DLL). These different locked loops are therefore instrumental in facilitating our modern interconnected society that relies on electronic devices and high-speed communication signaling.

However, "traditional" locked loops present a number of issues with respect to power management, and power management enables electronic devices to use less power and battery-powered ones to last longer between charges. For example, there is a tension, or tradeoff, between reducing power usage by locked loops and reducing operational latency. In other words, reducing power consumption can result in an increase in the frequency of periods during which an electronic device is waiting on a locked loop to lock and become fully functional. This latency-induced waiting causes the electronic device to be delayed before performing some computation and then providing some feature to an end user.

More specifically, locked loops can consume an appreciable amount of power while running, especially at higher frequencies. To help manage power usage, some electronic devices can reduce the power consumption of a locked loop by implementing a standby mode. The standby mode at least partially turns off the locked loop by causing the locked loop to cease running. However, while the locked loop is not running, the loop can drift out of lock, e.g., due to temperature or voltage changes. Each time a locked loop is restarted at the end of a standby mode period, some duration of time elapses before the locked loop can relock to a reference signal (e.g., a frequency or phase thereof) and produce an appropriate output signal (e.g., an oscillating signal with a desired frequency). Consequently, the power-management strategy of causing the locked loop to cease running to save power may create a delay that adversely impacts the performance of an electronic device. Further, for some given time after reenabling the locked loop, the accuracy of the output of the locked loop may be reduced as compared to strategies in which the locked loop does not cease running.

For a PLL example, when a locked loop is restarted, some amount of time elapses while the locked loop relocks to a reference frequency of a reference signal and begins producing an output signal having an output frequency that is based on the reference frequency (e.g., that is a multiple of the reference frequency). This relocking duration causes a latency that results in performance delays. In some cases, approximately 100 cycles of a reference signal from a reference signal source are applied to a "cold" loop before the locked loop can relock to the reference frequency. Especially with reference signals having lower frequencies, a duration equal to 100 times a period of the reference signal can introduce a significant delay each time the locked loop is restarted after a system-level standby mode ends.

To counteract the problems resulting from the delays caused by the relocking duration, a reference signal with a higher reference frequency could be utilized to accelerate the relocking. However, the higher reference frequency may incur a power penalty as faster reference signal sources typically consume more power. Alternatively, a lock detection threshold for a locked loop could be lowered such that a lock state is declared more quickly. But relaxing the detection threshold sacrifices an accuracy of the output signal of the locked loop. As another potential approach, with a digital locked loop, a binary search could be performed using an open loop scheme. Unfortunately, to achieve a lock quality that is comparable to a closed loop scheme, the open loop scheme may utilize a number of digital bits that may cause the binary search to take as long as the closed loop scheme. Furthermore, there is a fixed relock duration that is incurred even if the locked loop experiences no drift if the binary search is performed each time a standby mode period ends.

In contrast with the techniques described above, implementations described herein keep a locked loop "warm" during a system-level standby mode. Some such implementations reduce relocking durations and/or increase the accuracy of the locked loop for a given time after the locked loop exits the standby mode. Further, use of the techniques described herein may increase a mean up-time for a locked loop. To do so, power modes are separated into external power modes for a system and internal power modes controlled by the locked loop. Based on internal power modes, control circuitry of the locked loop spins up the locked loop to cause the locked loop to lock to a reference signal during an external low-power mode. In effect, the locked loop generates internal run modes and internal pause modes that can override the system-level, external power modes. Internal run modes may be triggered by a timer that ensures that the drifting away from a locked state is capped at some maximum internal standby duration, by a temperature sensor because higher temperatures can cause or accelerate drift, or by some other trigger parameter. Consequently, although the locked loop can still drift away from a locked state during an external standby mode, the amount of drift is constrained. The potential drifting amount is constrained because the internal timer can reduce a duration between a most-recent, internally-triggered locking event and some time at which a system-level, external standby mode ends. Thus, the locked loop can be restarted after system-level standby modes with shorter delays and/or with less impact on device performance.

FIG. 1 illustrates an example environment 100 that includes an electronic device 102 in which systems and methods of relocking for locked loops can be implemented. The example environment 100 includes the electronic device 102 that communicates with a base station 104 through a wireless communication link 106 (wireless link 106). In this example, the electronic device 102 is implemented as a smart phone. However, the electronic device 102 may be implemented as any suitable computing or other electronic device, such as a modem, access terminal, cellular base station, broadband router, access point, cellular phone, gaming device, navigation device, media device, laptop computer, desktop computer, tablet computer, wearable device such as a smart watch or augmented reality (AR) glasses, server computer, network-attached storage (NAS) device, smart appliance, vehicle-based communication system, Internet-of-Things (IoT) device, medical device, and so forth.

The base station 104 communicates with the electronic device 102 via the wireless link 106, which may be implemented as any suitable type of wireless link. Although depicted as a base station tower of a cellular radio network, the base station 104 may represent or be implemented as another device, such as a satellite, cable television head-end, terrestrial television broadcast tower, access point, peer-to-peer device, mesh network node, fiber optic line, another electronic device generally, and so forth. Hence, the electronic device 102 may communicate with the base station 104 or another electronic device via a wired connection, a wireless connection, or a combination thereof.

The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard, such as 3rd Generation Partnership Project Long-Term Evolution (3GPP LTE) (e.g., Fourth-Generation (4G) or Fifth-Generation (5G) wireless standards), IEEE 802.11, IEEE 802.16, Bluetooth™, and so forth.

The electronic device 102 includes a processor 108 and a computer-readable storage medium 110 (CRM 110). The processor 108 may include any type of processor, such as an application processor or a multi-core processor, that is configured to execute processor-executable instructions (e.g., code) stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus does not include transitory propagating signals or carrier waves.

The electronic device 102 may also include input/output ports 116 (I/O ports 116) or a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and so forth. The display 118 can be realized as a screen or projection that presents graphics of the electronic device 102, such as a user interface associated with an operating system, program, or application. Alternatively or additionally, the display 118 may be implemented as a display port or virtual interface through which graphical content of the electronic device 102 is communicated or presented.

For communication purposes, the electronic device 102 also includes at least one wireless transceiver 120 and at least one antenna 134. The wireless transceiver 120 provides connectivity to respective networks and other electronic devices connected therewith. Additionally or alternatively, the electronic device 102 may include a wired transceiver (not shown), such as an Ethernet or fiber optic interface for communicating over a personal or local area network (LAN), an intranet, or the Internet. The wireless transceiver 120 may facilitate communication over any suitable type of wireless network, such as a wireless LAN (WLAN), a peer-to-peer (P2P) network, a mesh network, a cellular network, a wireless wide-area-network (WWAN), and/or a wireless personal-area-network (WPAN). In the context of the example environment 100, the wireless transceiver 120 enables the electronic device 102 to communicate with the base station 104 and networks connected therewith.

The wireless transceiver 120 can include circuitry, logic, and other hardware for transmitting or receiving a wireless signal for at least one communication frequency band. In operation, the wireless transceiver 120 can implement at least one, e.g., radio frequency (RF) transceiver to process data and/or signals associated with communicating data of the electronic device 102 via the antenna 134. As shown, the wireless transceiver 120 includes at least one baseband modem 122. The baseband modem 122 may be implemented as a system on-chip (SoC) that provides a digital communication interface for data, voice, messaging, and other applications of the electronic device 102. The baseband modem 122 may also include baseband circuitry to perform high-rate sampling processes that can include analog-to-digital conversion (ADC), digital-to-analog conversion (DAC), gain correction, skew correction, frequency translation, and so forth. Alternatively, the baseband modem 122 may be implemented separately from the wireless transceiver 120.

Generally, the wireless transceiver 120 can include low-pass filters, band-pass filters, switches, amplifiers, and so forth for routing and conditioning signals that are transmitted or received via the antenna 134. As illustrated, the wireless transceiver 120 also includes at least one filter 124, at least one oscillating signal source 126, at least one loop utilization circuitry 128, and at least one mixer 132. In operation, the wireless transceiver 120 can provide some measure of attenuation for wireless signals at different frequencies using the filter 124 (e.g., a lowpass or bandpass filter). The wireless transceiver 120 can further perform frequency conversion using the mixer 132 and a signal synthesized with the oscillating signal source 126, such as a crystal oscillator. The frequency conversion process performed using the mixer 132 may involve an upconverter and/or a downconverter that performs frequency conversion in a single conversion step or through multiple conversion steps.

The wireless transceiver 120 may also include logic to perform in-phase/quadrature (I/Q) operations, such as synthesis, encoding, modulation, demodulation, and decoding using a synthesized signal. In some cases, components of the wireless transceiver 120 are implemented as separate receiver and transmitter entities. Additionally or alternatively, the wireless transceiver 120 can be realized using multiple or different sections to implement respective receiving and transmitting operations (e.g., using separate transmit and receive chains).

As shown, the loop utilization circuitry 128 includes at least one locked loop 130. The loop utilization circuitry 128 and the locked loop 130 may be implemented in many different ways. Three transceiver-related examples are explicitly depicted in FIG. 1 on the left, including two frequency synthesizers and one phase generator. Electronic devices use frequency synthesizers to create signals having different frequencies, and many frequency synthesizers include a phase locked loop (PLL) to generate a desired frequency by locking to a phase of a reference signal. Further, signals are often created, conditioned, or otherwise modified using other types of locked loops that can adjust other characteristics of signals. Other signal characteristics can include a frequency of a signal, a duration associated with a signal (e.g., a period between two signal markers, such as two rising or falling edges of a signal or a beginning and an ending of a period or cycle of a signal), and so forth. A frequency locked loop (FLL) can be used to generate a signal having a specified frequency, or a harmonic thereof, by locking onto a frequency of a reference signal. A delay locked loop (DLL) can be used to generate a signal that is associated with a specified delay by locking onto a duration associated with a reference signal.

In FIG. 1, three examples of the loop utilization circuitry 128 and the locked loop 130 are shown. In one example, the loop utilization circuitry 128 comprises a frequency synthesizer 128-1, and the locked loop 130 comprises a PLL 130-1. In another example, the loop utilization circuitry 128 comprises a frequency synthesizer 128-2, and the locked loop 130 comprises an FLL 130-2. In yet another example, the loop utilization circuitry 128 comprises a phase generator 128-3, and the locked loop 130 comprises a DLL 130-3. In operation, the frequency synthesizer 128-1 or the frequency synthesizer 128-2 can use, for instance, the oscillating signal source 126 and the PLL 130-1 or the FLL 130-2, respectively, to synthesize signals having one or more desired frequencies. Additionally or alternatively, the loop utilization circuitry 128 can comprise a clock generator (not shown). Other implementations and types of loop utilization circuitry 128 can also employ a locked loop 130 as described herein.

As shown in FIG. 1, the electronic device 102 can further include an external power manager 136. The external power manager 136 implements one or more techniques to manage power consumption across a system or over multiple components of the electronic device 102. Generally, a locked loop 130 or a combination of a locked loop 130 and an external power manager 136 can at least partially implement relocking for locked loops as described herein. An example locked loop 130 is described with reference to FIG. 2-1. An example locked loop 130, which includes an internal power manager, and an example external power manager 136 are described with reference to FIG. 3. An interaction between the internal power manager and the external power manager 136 is described with reference to FIGS. 3 and 4.

Figures 1, 2:
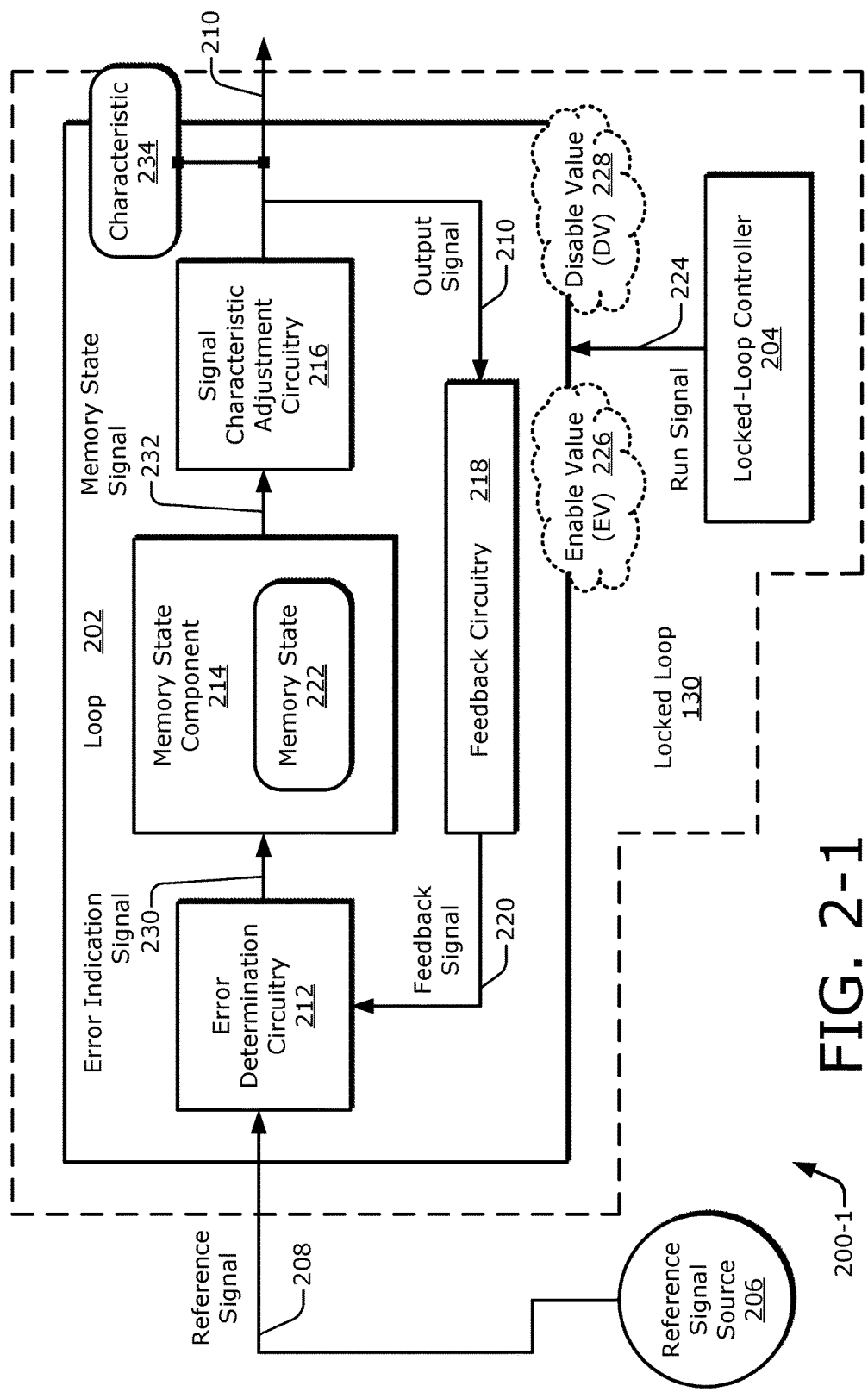
Figure 2:
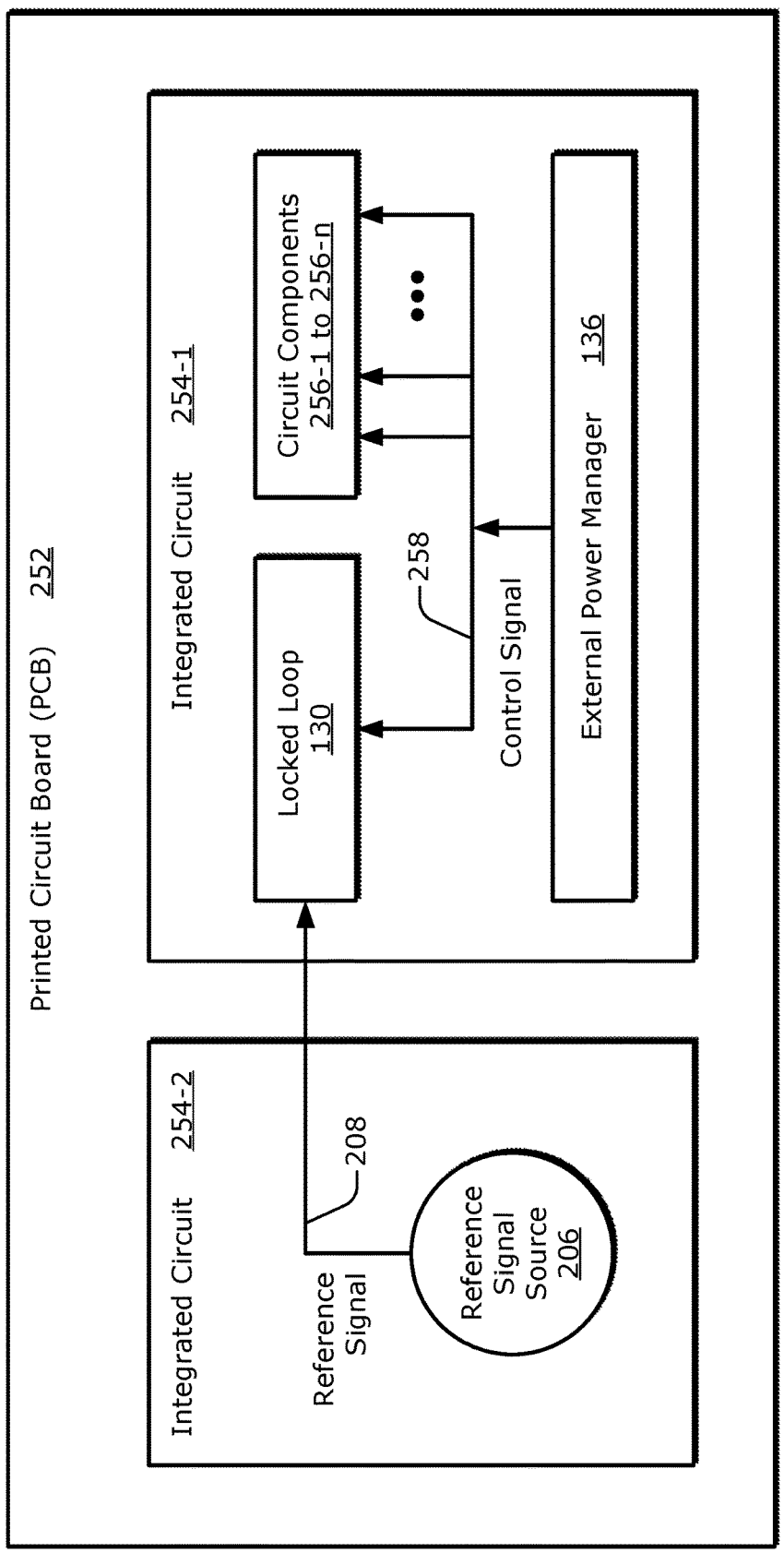

FIG. 2-1 illustrates, at 200-1, a loop 202, a locked-loop controller 204, and a reference signal source 206. FIG. 2-1 also depicts an example locked loop 130 that includes both the loop 202 and the locked-loop controller 204 with which relocking for locked loops can be implemented. As shown, the reference signal source 206 generates or otherwise provides a reference signal 208. The loop 202 accepts or receives the reference signal 208 and produces an output signal 210 based on the reference signal 208. The loop 202 includes multiple components, including error determination circuitry 212, a memory state component 214, signal characteristic adjustment circuitry 216, and feedback circuitry 218. The memory state component 214 includes a memory state 222.

In example implementations, the loop 202 operates in a feedback mode in which a version of the output signal 210 is fed back using a feedback loop that includes the feedback circuitry 218. The signal characteristic adjustment circuitry 216 produces the output signal 210 to have a characteristic 234 as is described below. The output signal 210 can be forwarded from the locked loop 130, such as for use by loop utilization circuitry 128 of FIG. 1. The signal characteristic adjustment circuitry 216 also provides the output signal 210 to the feedback circuitry 218. The feedback circuitry 218 provides a feedback signal 220 to the error determination circuitry 212. To do so, the feedback circuitry 218 can pass the output signal 210 onward substantially unchanged as the feedback signal 220. Alternatively, the feedback circuitry 218 can process the output signal 210 to produce a modified signal that is forwarded as the feedback signal 220. For example, the feedback circuitry 218 can divide a frequency of the output signal 210 or convert the output signal 210 into a form that is readily usable by the error determination circuitry 212.

The error determination circuitry 212 receives the reference signal 208 and the feedback signal 220. The error determination circuitry 212 is configured to compare the feedback signal 220 to the reference signal 208. The error determination circuitry 212 determines a difference between the reference signal 208 and the feedback signal 220 or a deviation of the feedback signal 220 from the reference signal 208. This difference or deviation is encoded as or is represented by an error indication. The error determination circuitry 212 provides the error indication as an error indication signal 230. Thus, the error determination circuitry 212 provides the error indication signal 230 to the memory state component 214.

The memory state component 214 receives the error indication signal 230 from the error determination circuitry 212. The memory state component 214 is configured to store a version of the error indication as the memory state 222. The memory state 222 can represent how (e.g., in which direction) or to what extent (e.g., a magnitude) the characteristic 234 is to be adjusted to bring the loop 202 into a locked state. In these manners, the memory state component 214 provides a memory mechanism for storing a memory state. The memory state component 214 provides the memory state 222 via the memory state signal 232 to the signal characteristic adjustment circuitry 216.

The signal characteristic adjustment circuitry 216 receives the memory state signal 232 from the memory state component 214. Thus, the signal characteristic adjustment circuitry 216 can adjust the characteristic 234 of the output signal 210 based on the memory state 222 using the memory state signal 232. For example, the signal characteristic adjustment circuitry 216 can increase or decrease the characteristic 234 based on the memory state 222. The signal characteristic adjustment circuitry 216 can therefore comprise state-controlled signal characteristic adjustment circuitry. In these manners, the signal characteristic adjustment circuitry 216 can provide an adjustment mechanism for adjusting a characteristic 234 of the output signal 210 based on the memory state 222.

The adjusted output signal 210 is then fed back from the signal characteristic adjustment circuitry 216 to the error determination circuitry 212 via the feedback circuitry 218, as is described above. In operation, the feedback process can continue to change the characteristic 234 until the output signal 210 is locked to the reference signal 208 to some locking criterion threshold. This feedback process is active while the loop 202 is running. The locked-loop controller 204 determines whether the loop 202 is running or is not running using a run signal 224.

In example implementations, the locked-loop controller 204 generates the run signal 224. The run signal 224 can have at least an enable value 226 (EV) or a disable value 228 (DV). Thus, the run signal 224 can be implemented as a single line on which the locked-loop controller 204 drives a high or a low voltage or some other Boolean indicator. Alternatively, the run signal 224 can be implemented using a more complex or different scheme, such as one with multiple lines and differently coded run commands. Example approaches to establishing a value for the run signal 224, including various criteria or different power management scenarios, are described below with reference to FIGS. 3 and 4. In operation for the locked loop 130, the loop 202 is configured to run responsive to the run signal 224 having the enable value 226. And the loop 202 is configured to not run or to cease running responsive to the run signal 224 having the disable value 228. While the loop 202 is not running, the reference signal 208 can be gated off from the loop 202 by the locked-loop controller 204. If the loop 202 is running, the loop 202 is operating in a feedback mode to lock or keep locked the output signal 210 to the reference signal 208.

The locked loop 130 can be implemented using analog circuitry, digital circuitry, or a combination thereof. If the loop 202 is implemented using digital circuitry, the memory state component 214 can be implemented with at least one accumulator having a register. A digital register can store a digital value that is representative of the memory state 222. In this example, the digital value is forwarded as the memory state signal 232 to the signal characteristic adjustment circuitry 216. If, on the other hand, the loop 202 is implemented using analog circuitry, the memory state component 214 can be implemented with a loop filter including a capacitor having a voltage differential. The capacitor can store an analog voltage level (e.g., as a voltage differential across two capacitor plates) that is representative of the memory state 222. In this example, the analog voltage level is provided as the memory state signal 232 to the signal characteristic adjustment circuitry 216.

As described above with reference to FIG. 1, the locked loop 130 can be implemented as a PLL 130-1, an FLL 130-2, a DLL 130-3, and so forth. If the locked loop 130 is implemented as a PLL 130-1, the signal characteristic adjustment circuitry 216 can be implemented with a variable oscillator, and the characteristic 234 can comprise a phase of the output signal 210. If the locked loop 130 is implemented as an FLL 130-2, the signal characteristic adjustment circuitry 216 can be implemented with a variable oscillator, and the characteristic 234 can comprise a frequency of the output signal 210. If the locked loop 130 is implemented as a DLL 130-3, the signal characteristic adjustment circuitry 216 can be implemented with a variable delay circuit, and the characteristic 234 can comprise a delay or duration associated with some aspect of the output signal 210.

For better understanding, an example of the loop 202 being implemented as a PLL 130-1 is described next. In such an example implementation, the characteristic 234 can comprise a phase—which corresponds to a frequency—of the output signal 210. The output signal 210 is provided to the feedback circuitry 218, which can be implemented as a frequency divider so that the frequency of the output signal 210 locks to some multiple of the reference signal 208 based on a divider value of the frequency divider. In a digital PLL, the feedback circuitry 218 can be implemented using a digital decoder. The error determination circuitry 212 can be implemented using a phase frequency detector (PFD) or a PFD in conjunction with a charge pump for an analog PLL. In a digital PLL, the error determination circuitry 212 can be implemented using a combiner that determines a difference between a feedback code of the feedback signal 220 and a digital value representative of the reference signal 208. The memory state component 214 can be implemented using a capacitor that can be charged to an analog voltage level as part of a loop filter (in an analog PLL) or using an accumulator with a digital register (in a digital PLL). The signal characteristic adjustment circuitry 216 can be implemented using a state-controlled oscillator, such as a voltage-controlled oscillator (VCO) for an analog PLL.

FIG. 2-2 illustrates an example device environment 200-2 to implement systems and methods of relocking for locked loops. The example device environment 200-2 includes at least one printed circuit board 252 (PCB 252). The printed circuit board 252 can be disposed within a housing of the electronic device 102 of FIG. 1 and can be fabricated to be flexible or stiff. As shown, the printed circuit board 252 supports multiple integrated circuits, including a first integrated circuit 254-1 and a second integrated circuit 254-2. The second integrated circuit 254-2 includes the reference signal source 206, which provides a reference signal 208 as described above with reference to FIG. 2-1. The first integrated circuit 254-1 includes the locked loop 130, the external power manager 136, and multiple circuit components 256-1 . . . 256-*n*, with "n" representing a positive integer.

In example implementations, the external power manager 136 provides at least one control signal 258 to the locked loop 130 and the multiple circuit components 256-1 . . . 256-*n*. The control signal 258 can be asserted to indicate a power command as described herein (e.g., to provide an external power mode signal 306 as described below starting with reference to FIG. 3). The first integrated circuit 254-1 can be implemented as, for example, a baseband modem 122 or other communication processor, a general-purpose processor, a system-on-chip (SOC), a graphics processing unit (GPU), an artificial intelligence (AI) processor, or some combination thereof. Thus, each circuit component 256 of the multiple circuit components 256-1 . . . 256-*n* can be implemented as, for example, a processing core, a memory block, a memory controller, a display block, an input/output interface unit, a digital signal processor (DSP), a wireless connectivity unit, a multimedia processor, a camera block, a matrix multiplication unit, an AI-coprocessor, a controller, a navigational unit, another locked loop, or combinations thereof. Here, the external power manager 136 is external to the multiple circuit components 256-1 . . . 256-*n* and the locked loop 130. These illustrated circuit components can be distributed over the first integrated circuit 254-1 in any manner. Alternatively, the multiple circuit components 256-1 . . . 256-*n* can be distributed across the printed circuit board 252 as different integrated circuits or circuit portions thereof.

In example operations, the reference signal source 206 is configured to be always-on in the sense that the reference signal source 206 can continue to provide the reference signal 208 to the first integrated circuit 254-1, including to the locked loop 130, even if the external power manager 136 uses the control signal 258 to indicate a low-power mode. Accordingly, the reference signal source 206 can be implemented using, for instance, a relatively low-power crystal oscillator (XO) with a frequency in the tens of kilohertz (e.g., 32 kHz). Another reference signal source (not shown) can have a frequency in the tens of megahertz (MHz), use more power, and be powered down during a low-power mode. The reference signal source 206 can alternatively be implemented with the locked loop 130 on the first integrated circuit 254-1.

Although certain example implementations and environments are depicted in FIGS. 1, 2-1, and 2-2 and described herein above, systems and methods of relocking for locked loops can be implemented in alternative manners. For example, the external power manager 136 and the locked loop 130 can be disposed on separate integrated circuit chips. Further, a local oscillator (e.g., a local oscillator 518 as described below with reference to FIGS. 5-1 to 5-4) that is on the first integrated circuit 254-1 and/or that is part of the locked loop 130 can provide a reference signal in lieu of one from the reference signal source 206, especially if the oscillation frequency of such a local oscillator is known and/or managed across temperature and voltage fluctuations.

Figure 3:
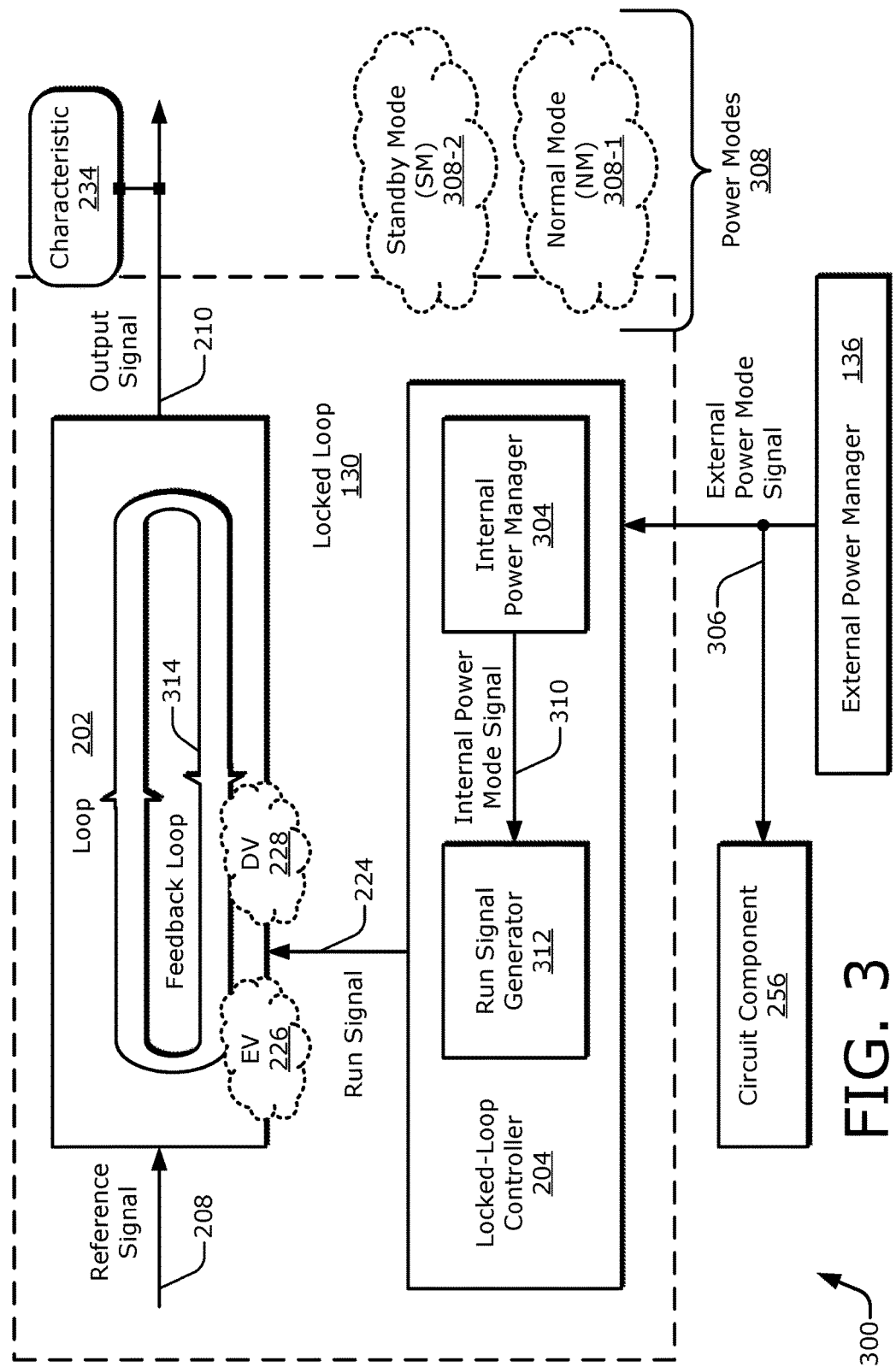
FIG. 3 illustrates an external power manager and an example locked loop in which a locked-loop controller includes an internal power manager in accordance with some implementations for relocking for locked loops.

FIG. 3 illustrates generally at 300 an external power manager 136 and an example locked loop 130. In the locked loop 130, the locked-loop controller 204 includes an internal power manager 304 and a run signal generator 312 in accordance with some implementations for relocking for locked loops. The loop 202 includes a feedback loop 314, examples of which are described above with reference to FIG. 2-1. FIG. 3 also illustrates both the external power manager 136 and a circuit component 256 as being at least logically outside of the locked loop 130.

In example implementations, the external power manager 136 separately or in conjunction with the internal power manager 304 establishes multiple power modes 308. Examples of the power modes 308 include a normal mode 308-1 (NM), a standby mode 308-2 (SM), and so forth. Although two power modes are explicitly depicted and described herein, the multiple power modes 308 may include other power modes or a greater quantity of power modes. The normal mode 308-1 corresponds to one or more power modes or levels in which a locked version of the output signal 210 is to be used for some electronic functionality, such as in a regular power mode or a boost performance power mode. In contrast, the standby mode 308-2 corresponds to one or more power modes or levels in which a locked version of the output signal 210 is not to be used for electronic functionality. Examples of standby modes 308-2 include a sleep mode, a retention power mode, a low-power mode, a mode in which a component—such as a wireless transceiver or an integrated circuit core—that uses the locked loop 130 is paused or temporarily turned off, combinations thereof, and so forth.

In operation, the external power manager 136 provides an external power mode signal 306 to the locked loop 130 and at least one other component of the electronic device, such as the circuit component 256. Thus, the external power manager 136 provides the external power mode signal 306 to at least one other circuit component 256 that is not a locked loop or to at least one other locked loop besides the locked loop 130 (e.g., to multiple locked loops). If the external power mode signal 306 is configured to establish a system-level power mode, the system can correspond to an electronic device, a motherboard, a wireless chipset, an integrated circuit (IC) chip, a core or other portion of an IC chip, a signal generation subsystem, and so forth.

The locked-loop controller 204 produces the run signal 224 based on the external power mode signal 306. In some implementations, if the run signal 224 has the enable value 226, the feedback loop 314 is configured to run to lock the characteristic 234 of the output signal 210 to some aspect of the reference signal 208. If the run signal 224 has the disable value 228, the loop 202 is configured to not run and to not create or maintain a locked state. In some implementations, the loop 202 can be disabled so as not to run by depowering an oscillator, such as by disconnecting from a voltage supply an oscillator (not shown) that is included as part of the signal characteristic adjustment circuitry 216 to produce the output signal 210. Additionally or alternatively for other implementations, the loop 202 can be disconnected from power, the reference signal 208 can be gated from the error determination circuitry 212, and so forth. While the loop 202 is not running, the locked loop 130 consumes less power. However, due to environmental or other factors—such as temperature or voltage changes, the memory state 222 (of FIG. 2-1) can drift away from being in a locked state while the loop 202 is not running. For example, with temperature or voltage changes, a value of the memory state 222 may drift. Alternatively, although a value of the memory state 222 may remain constant, the temperature or voltage changes may cause surrounding circuitry to have behavior changes which render the constantly-valued memory state 222 no longer able to achieve a locked state. Thus, in either case, environmental or other factors can cause the memory state 222 of the memory state component 214 to diverge from being in a locked state and thereby exhibit a drift error.

To prevent the drift from becoming too excessive, which would result in an increased relocking duration after the loop 202 is restarted, the locked-loop controller 204 can spin up the loop 202 during a time when the external power manager 136 has instructed the locked loop 130 to be on standby. The locked-loop controller 204 can therefore keep the loop 202 warm during a standby mode 308-2 that is established externally by the external power manager 136. In these manners, the locked-loop controller 204 can provide a control mechanism for keeping the loop 202 warm responsive to an external power mode signal 306 being indicative of an external standby mode, with the control mechanism configured to provide the run signal 224 to the loop 202.

In example implementations, the external power manager 136 can cause the external power mode signal 306 to be indicative of the normal mode 308-1 or the standby mode 308-2. The internal power manager 304 produces an internal power mode signal 310 responsive to the external power mode signal 306, such as by being based on which power mode is being indicated by the external power mode signal 306. Generally, the internal power manager 304 can produce the internal power mode signal 310 to indicate an internal run mode or an internal pause mode. Thus, the internal power manager 304 can establish a modified internal version of the normal mode 308-1 as an internal run mode and a modified internal version of the standby mode 308-2 as an internal pause mode with respect to at least whether the loop 202 runs for locking purposes (e.g., runs to at least start converging towards a locked state).

The internal power manager 304 provides the internal power mode signal 310 to the run signal generator 312. Based on these internal power mode versions as indicated by the internal power mode signal 310, the run signal generator 312 can generate the run signal 224 to have the enable value 226 or the disable value 228. This approach partially decouples internal operational running of the loop 202 from the external power modes established by the external power manager 136. To do so, the internal power manager 304 and the run signal generator 312 establish certain internal power modes or drive particular values on the internal power mode signal 310 or the run signal 224, respectively. Although certain logical functionalities of the locked-loop controller 204 are separated into separate blocks herein (e.g., into the internal power manager 304 and the run signal generator 312) to facilitate understanding, the corresponding operation(s) may be performed in some implementations monolithically by the locked-loop controller 204 such that the run signal 224 comprises an internal power mode signal 310, which is described below. In other words, one or more logical states of the internal power mode signal 310 can be both represented and realized by the run signal 224. This is described below with reference to the example signaling depicted in FIG. 4.

To establish internal power modes or drive values on signals, voltages are generated (or used) and currents flow within the locked loop 130. Further, the circuitry of the locked-loop controller 204 can be operated in accordance with an internal clock signal. Other external circuitry, such as the external power manager 136 or the circuit component 256, can be affected by this activity. To protect the external circuitry from this internal refresh activity, these electrical values or the internal clock signal (or both) can be gated to separate the activity of the locked loop 130 from the surrounding circuitry, at least during the external standby mode 308-2. Further, the output signal 210 or the lock state indicator 512 can also be gated during these times. Gating of the output signal 210 is depicted graphically in FIG. 4 relative to other signals for power modes and loop enablement.

Figure 4:
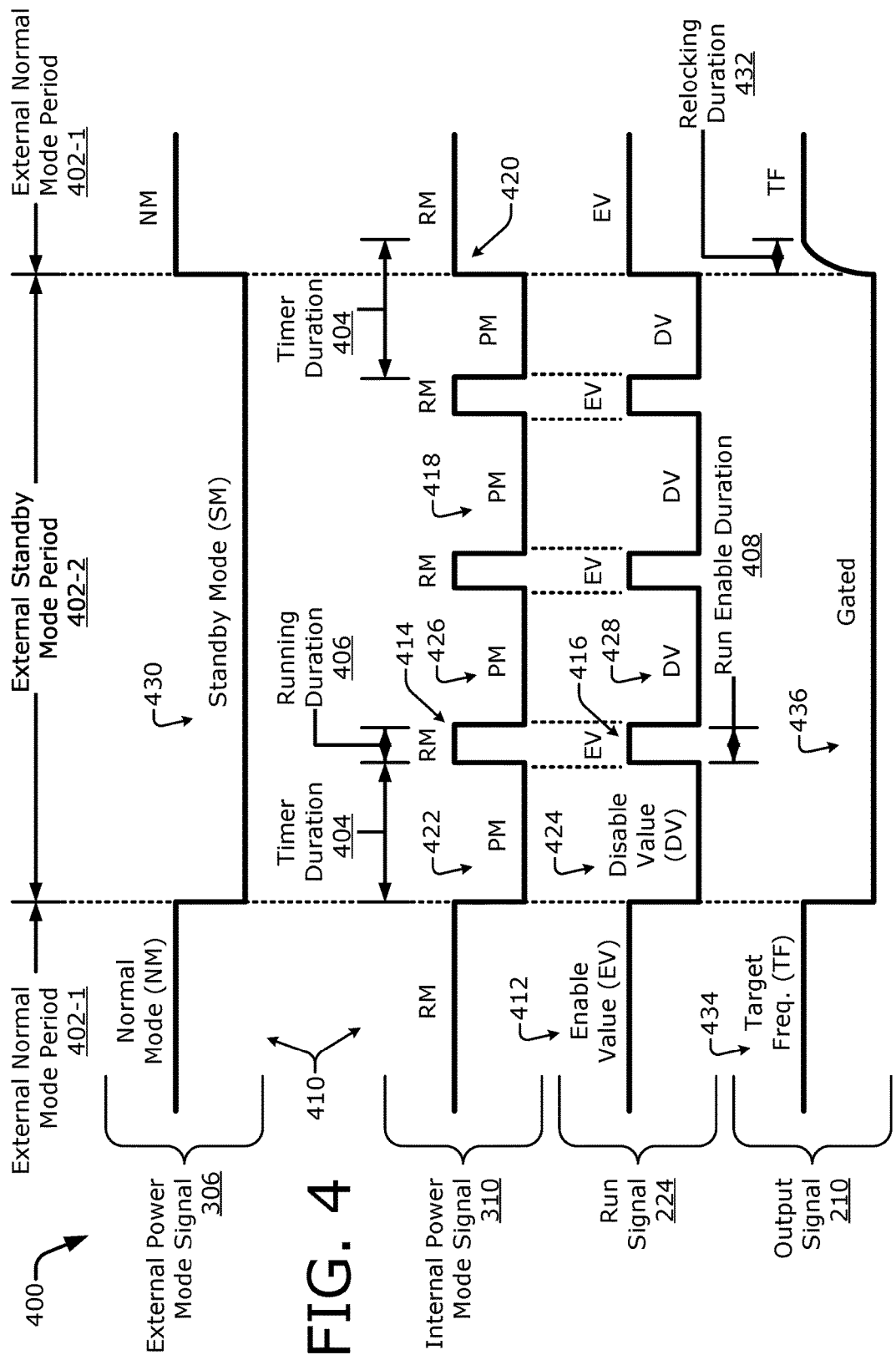
FIG. 4 depicts signal timing diagrams that illustrate example relationships between an external power mode signal and an internal power mode signal, as well as a corresponding run signal supplied to a loop of a locked loop to implement relocking for locked loops.

FIG. 4 depicts generally at 400 multiple signal timing diagrams that illustrate example relationships between the external power mode signal 306 and the internal power mode signal 310. FIG. 4 also illustrates a corresponding run signal 224 that can be supplied to the loop 202 of the locked loop 130 and the output signal 210. For clarity, the reference numbers "226,", "228," "308-1," and "308-2" for run values and power modes are omitted. The external power manager 136 establishes multiple external power modes and thus creates multiple external power mode periods. Example ones of these periods are depicted along the top of the signal timing diagrams. These external power modes include an external normal mode period 402-1 and an external standby mode period 402-2.

While the external power mode signal 306 is indicative of the normal mode (NM), the external power manager 136 is instituting an external normal mode period 402-1. While the external power mode signal 306 is indicative of the standby mode (SM), the external power manager 136 is instituting an external standby mode period 402-2. The internal power manager 304 produces the internal power mode signal 310 responsive to the mode indicated by the external power mode signal 306. For example, if the external power mode signal 306 is indicative of the normal mode (NM), the internal power manager 304 sets the internal power mode signal 310 to be indicative of an internal run mode (RM), as shown at 410. To implement this, the internal power manager 304 can logically process the received external power mode signal 306 and forward another signal as the internal power mode signal 310 or can merely pass the externally-received signal onward as the internal power mode signal 310. In response to the internal power mode signal 310 being indicative of the internal run mode (RM), the run signal generator 312 drives the run signal 224 at the enable value (EV), as shown at 412.

In contrast, if the external power mode signal 306 is indicative of the standby mode (SM) as shown at 430, the locked-loop controller 204 overrides this indication, at least sometimes. To do so, the internal power manager 304 sets the internal power mode signal 310 to be indicative of an internal run mode (RM), as shown at 414, while the external power mode signal 306 is indicative of the standby mode (SM). In response to the internal power mode signal 310 being indicative of the internal run mode (RM), the run signal generator 312 drives the run signal 224 at the enable value (EV) at a corresponding time, as shown at 416. Consequently, during at least part of the time that one or more external components are in a standby mode during a system-level, external standby mode period 402-2, the loop 202 (e.g., of FIGS. 2 and 3) is running to lock, or to at least begin locking, the output signal 210 responsive to the enable value (EV) on the run signal 224.

Generally, the locked-loop controller 204 repeatedly establishes an internal run mode during the external standby mode period 402-2 while the external power manager 136 is establishing an external standby mode. To reduce power consumption, the internal power manager 304 also establishes at least one pause mode (PM), as shown at 418. However, by repetitively driving the enable value (EV) on the run signal 224, the locked-loop controller 204 can keep the loop 202 warm during a low-power period. As explained further below, the amount of drift by the loop 202 may be constrained by a timer duration 404. This constrained amount of drift can reduce a relocking duration 432 that can occur and/or reduce an amount of inaccuracy that can result as the external standby mode period 402-2 ends and a next external normal mode period 402-1 starts responsive to the external power mode signal 306 again being indicative of the normal mode (NM) and the internal power mode signal 310 again being indicative of the run mode (RM), as shown at 420.

The relocking duration 432 is indicated relative to the output signal 210. During the external normal mode period 402-1 on the left, the output signal 210 is locked to a target frequency 434 (TF 434). During the external standby mode period 402-2, the output signal 210 can be gated, as shown at 436. The output signal 210 may be gated, for example, "continuously" during the external standby mode period 402-2 responsive to the external power mode signal 306 or intermittently responsive to the internal power mode signal 310 or the run signal 224. The output signal 210 is shown as being gated at 436 in accordance with the external power signal 306. During the external normal mode period 402-1 on the right, the output signal 210 is shown locking to the target frequency 434 (TF 434) during the relocking duration 432 and then being in a locked state at the target frequency 434.

Figures 1, 5:
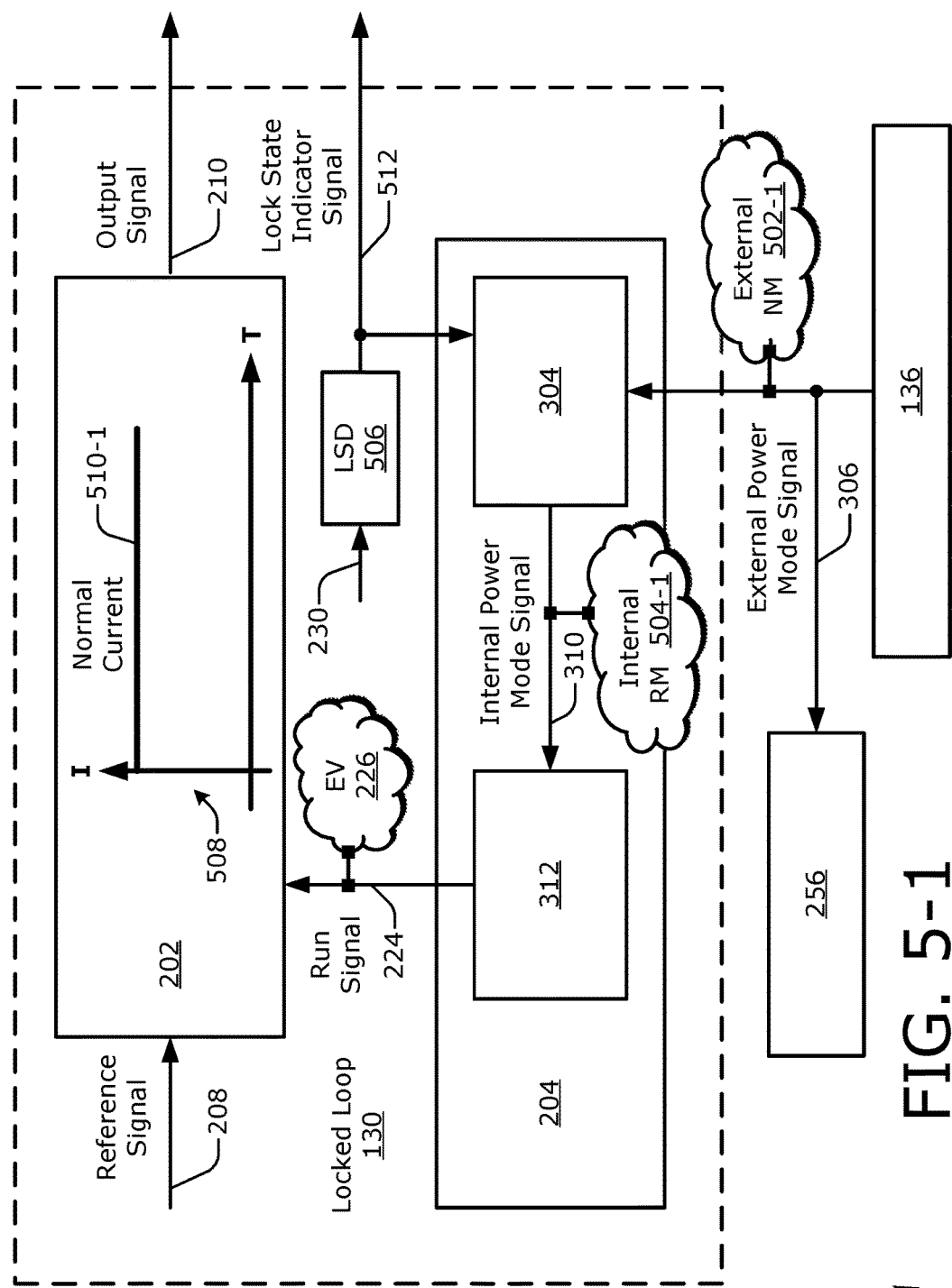
Figures 2, 5:
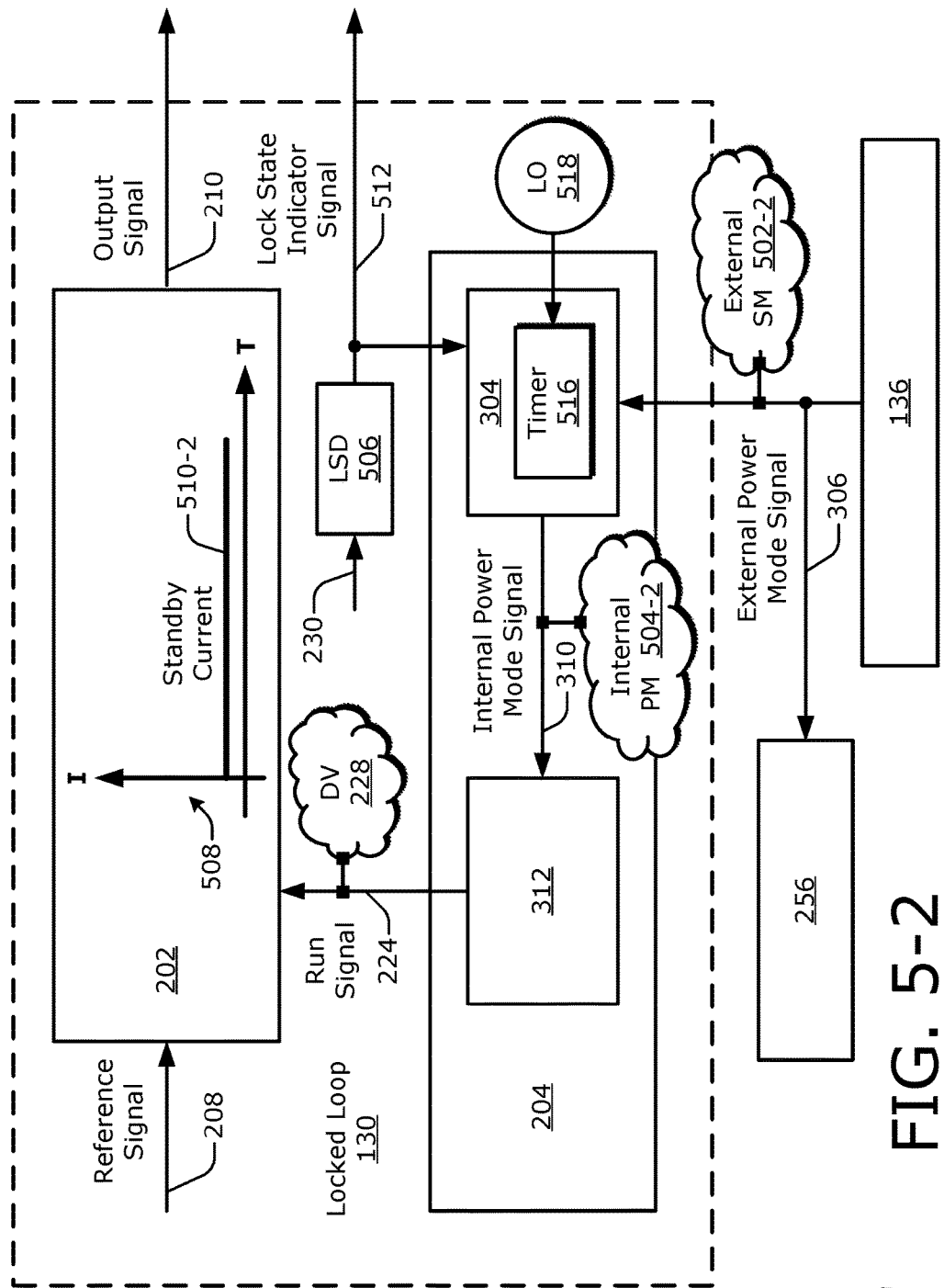
Figures 3, 5:
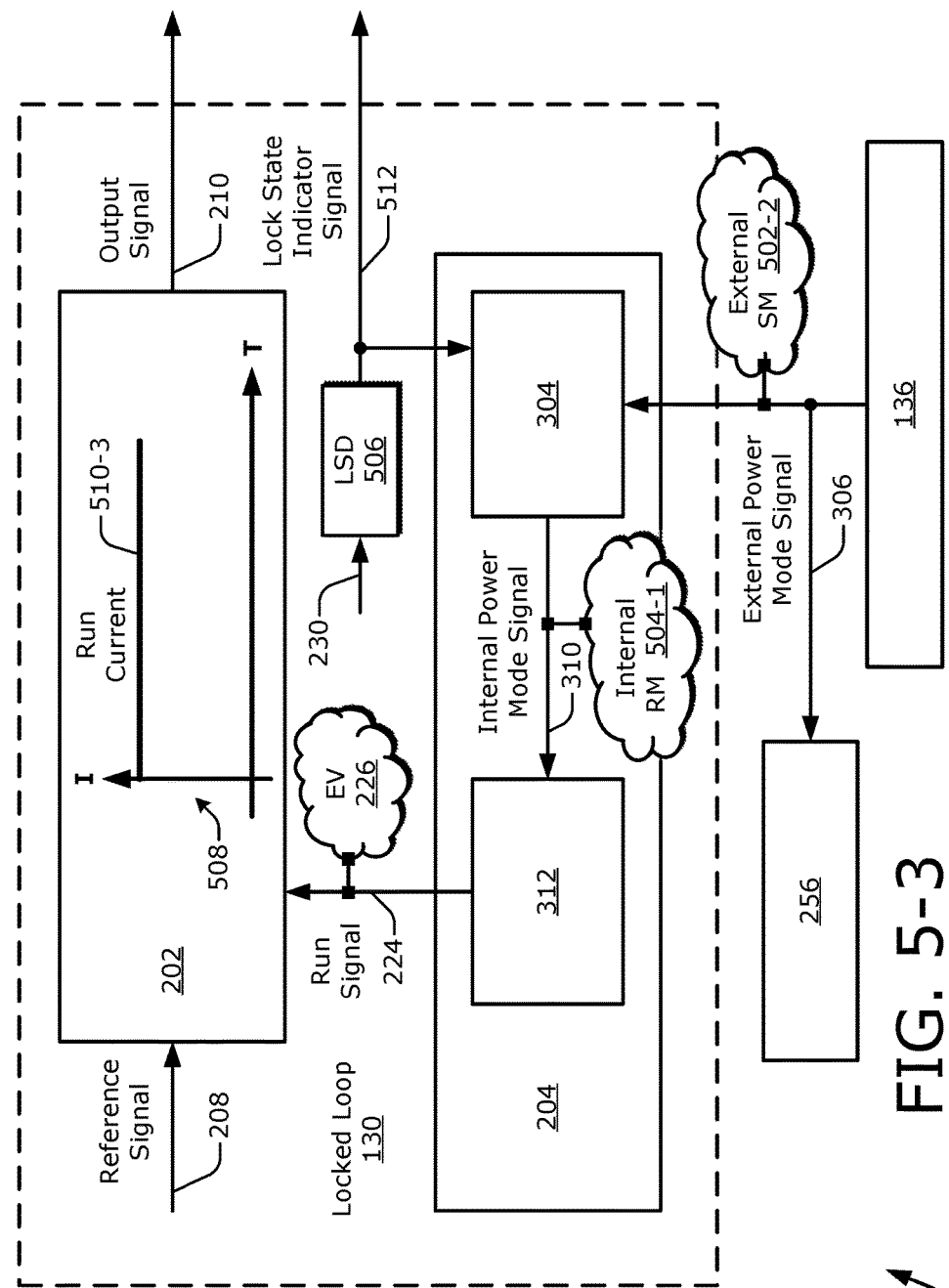
Figures 4, 5:
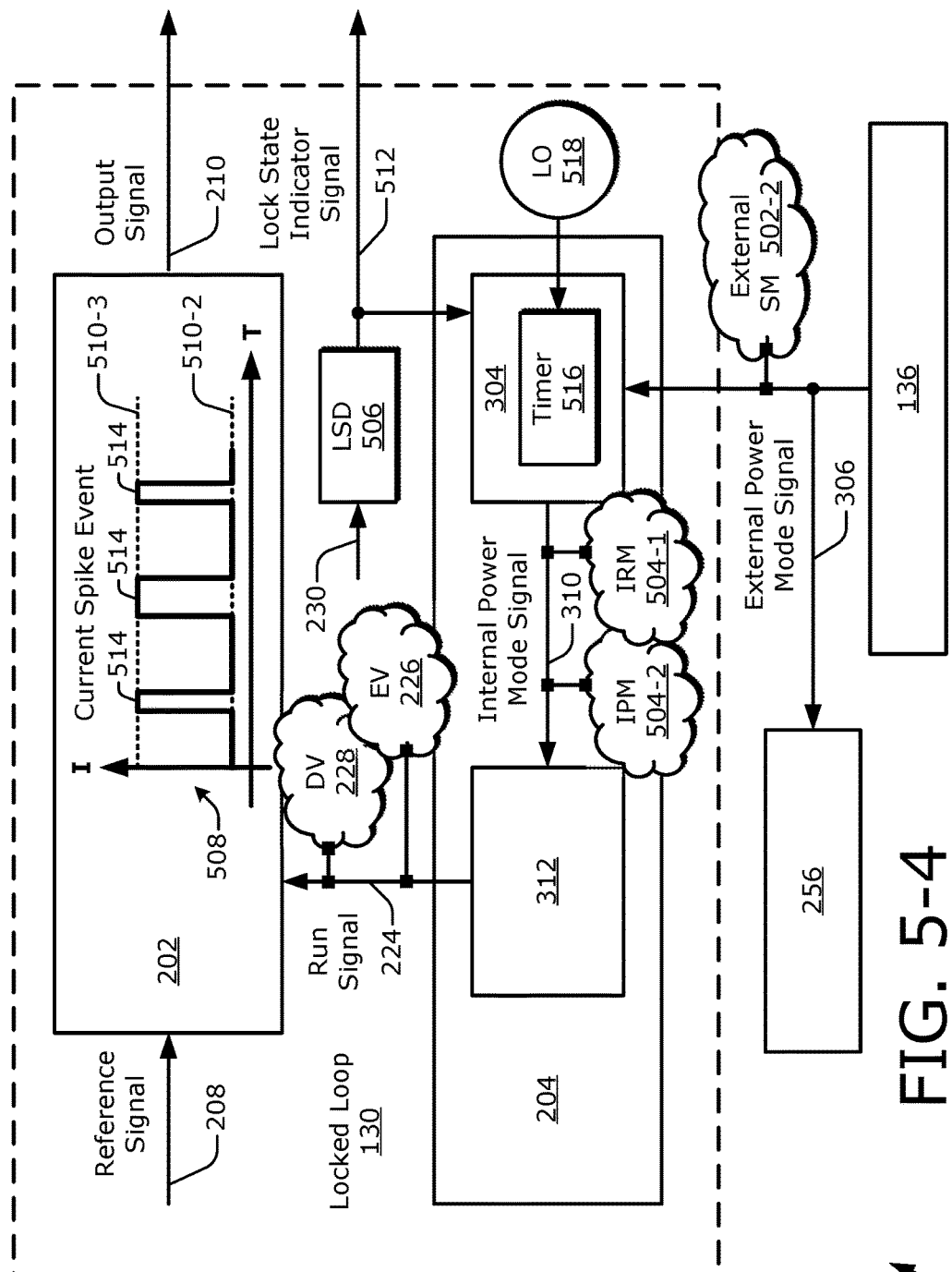

In the illustrated example, the internal power manager 304 causes the internal power mode signal 310 to be indicative of the pause mode (PM) responsive to an initial change of the external power mode signal 306 becoming indicative of the standby mode (SM), as shown at 422. Responsive to the internal power mode signal 310 being set to the pause mode (PM), the run signal generator 312 sets the run signal 224 to the disable value (DV), as shown at 424. This causes the loop 202 to cease running and therefore saves power. The internal power manager 304 may start a timer (which is shown in FIGS. 5-2 and 5-4). The timer expires after a timer duration 404. By way of example, an external standby mode period 402-2 may extend for 100s of milliseconds or even several seconds; in contrast, the timer duration 404 may be set to be approximately 100 reference signal cycles, or several milliseconds for the internal pause mode (PM). However, other lengths of both periods may alternatively be implemented. A length of the timer duration 404 trades the relocking duration 432 against power saving because the longer the length of the timer, the more time that can elapse after an internal locking event to permit further drifting before a current external standby mode period 402-2 is terminated. In other words, the length of the timer duration 404 can be configured to be relatively shorter if a faster relocking duration 432 is a priority versus relatively longer if power saving is a priority. Responsive to expiration of the timer, the internal power manager 304 changes the internal power mode signal 310 to be indicative of the internal run mode (RM), as shown at 414.

During this first time that the internal power mode is established to be the internal run mode (RM) while the external power mode is in the standby mode (SM), the run signal generator 312 drives the run signal 224 at the enable value (EV), as shown at 416. In these manners, the run signal generator 312 (of FIG. 3) provides a generation mechanism for generating the run signal 224 to have an enable value (EV) during at least part of an external standby mode period 402-2 instituted by the external power mode signal 306 being indicative of the external standby mode. Further, the locked-loop controller 204 causes the loop 202 to run to substantially lock the loop 202 to a reference signal 208 at this first time during the external standby mode period 402-2. This running continues until the loop 202 reaches at least a substantially locked state, which can be determined based on a lock state indicator signal (e.g., as shown in FIG. 5-3), which is controlled based on a lock criterion threshold. Alternatively, the running of the loop 202 may continue for some time period that is established or tracked by a timer (e.g., a timer 516 of FIG. 5-2 or the like). In the latter case, which can be configured to operate in accordance with a duty cycle, a fully-locked state may not be achieved, but the loop 202 is still kept warm in the sense that drift is not permitted to continue unchecked throughout an external standby mode 430. The time that elapses while the loop 202 is running (e.g., until a locked state is attained or a timer expires) is indicated by the running duration 406.

Upon locking in accordance with a locking threshold, the internal power manager 304 changes the internal power mode signal 310 to be indicative of the pause mode (PM), as shown at 426. In these manners, the internal power manager 304 (of FIG. 3) provides a power mode mechanism for establishing for the loop 202 a series of power modes including multiple internal pause modes (PMs) and multiple internal run modes (RMs) while the external power mode signal 306 is indicative of the external standby mode (SM). Responsive to the change to the internal power mode signal 310 to be indicative of the pause mode (PM), the run signal generator 312 changes the run signal 224 to the disable value (DV), as shown at 428. This change to the run signal 224 causes the loop 202 to cease locking at a second time during the external standby mode period 402-2.

The beginning and the ending of the run signal 224 having the enable value (EV) jointly define a run enable duration 408. To further save power, the run enable duration 408 can be configured to be substantially equal to the locking duration 406, except for a time period occupied by circuitry that is processing signals and causing the loop 202 to cease running after the locked state is detected. In these manners, the locked-loop controller 204 can keep the loop 202 warm during an external standby mode corresponding to an external standby mode period 402-2 to reduce a relocking duration 432 that elapses and/or to increase device accuracy after the external standby mode is terminated relative to a relocking duration or an accuracy level, respectively, for a cold loop that is not intermittently spun back up to a locked state.

FIGS. 5-1 to 5-4 illustrate different example operational states 500-1 to 500-4, respectively, of a locked loop 130 as an external power mode signal 306 and an internal power mode signal 310 vary over time. Across the four figures, the external power mode signal 306 can be indicative of an external normal mode 502-1 or an external standby mode 502-2, and the internal power mode signal 310 can be indicative of an internal run mode 504-1 or an internal pause mode 504-2. In each operational state 500, a current draw graph 508 depicts a current consumption (I) by the loop 202 versus elapsed time (T). FIGS. 5-1 to 5-4 also depict a lock state detector 506 (LSD). Based on at least one lock criterion threshold and at least one signal of the locked loop 130, the lock state detector 506 produces a lock state indicator signal 512. In the illustrated example, the lock state detector 506 performs a locked state detection operation using the lock criterion threshold and the error indication signal 230. For example, if the error indication signal 230 reaches zero or falls below the lock criterion threshold, the lock state detector 506 can assert the lock state indicator signal 512 to indicate a locked state of the loop 202. The lock state indicator signal 512 indicates whether or not the loop 202 is operating within specified parameters to achieve a locked state.

In an operational state 500-1 of FIG. 5-1, the external power manager 136 is providing the external power mode signal 306 with an indication of the external normal mode 502-1 (external NM 502-1). The internal power manager 304 is configured to adhere to the external power mode signal 306 being indicative of the external normal mode 502-1. Thus, responsive to the indicated external normal mode 502-1, the internal power manager 304 produces an internal power mode signal 310 that is indicative of the internal run mode 504-1 (internal RM 504-1). The run signal generator 312 generates the run signal 224 responsive to the internal power mode signal 310.

Responsive to the internal power mode signal 310 being indicative of the internal run mode 504-1, the run signal generator 312 generates the run signal 224 having an enable value 226 (EV 226). Responsive to the enable value 226 of the run signal 224, the loop 202 runs to lock the output signal 210 to the reference signal 208. During the running of the loop 202, the loop 202 draws an active amount of current. Accordingly, the current draw graph 508 depicts a normal current 510-1 for an intersection of the internal run mode 504-1 and the external normal mode 502-1. This operational state 500-1 continues until the external power mode signal 306 changes to a different power mode.

With reference to FIG. 5-2, the external power manager 136 triggers a change from the operational state 500-1 to an operational state 500-2 by changing the external power mode signal 306 to be indicative of the external standby mode 502-2 (external SM 502-2). Responsive to the change to the external standby mode 502-2, the internal power manager 304 changes the internal power mode signal 310 to being indicative of the internal pause mode 504-2 (internal PM 504-2). Responsive to the indication of the internal pause mode 504-2, the run signal generator 312 drives the run signal 224 to have the disable value 228 (DV 228). By driving the disable value 228 on the run signal 224, the run signal generator 312 causes the loop 202 to cease running. This permits the memory state 222 of the memory state component 214 (of FIG. 2-1) to diverge from being in a locked state, e.g., as temperature or voltage changes occur. The divergence from being locked may result from the memory state 222 changing (e.g., if an analog voltage on a capacitor leaks over time) or from surrounding circuitry changing (e.g., while a digital value of the memory state 222 remains constant).

While the loop 202 is not running, the loop 202 can draw a retention amount of current. Accordingly, the current draw graph 508 depicts a standby current 510-2 for the internal pause mode 504-2. This operational state 500-2 can continue until a trigger occurs. In some implementations, the trigger is realized using an expiration of a time period, such as the timer duration 404 (of FIG. 4). To do so, the internal power manager 304 can include a timer 516. The timer 516 monitors an elapsed time and triggers a change to the internal power mode upon expiration thereof in accordance with the timer duration 404. The timer 516 can operate using an oscillating signal obtained from the reference signal source 206 (of FIG. 2-1) if available, a local oscillator 518 (LO 518)—e.g., a low-power 1 kilohertz (KHz) oscillator that is disposed on a same chip as the locked loop 130, or another oscillating signal source. In other implementations, the trigger to switch to the internal run mode 504-1 (as discussed next with reference to FIG. 5-3) is realized using a parameter determined by a sensor, such as a temperature determined by a temperature sensor. To do so, the internal power manager 304 can obtain the temperature from a temperature sensor (not shown). The temperature sensor can be located on a same die as the locked loop 130 or a different integrated circuit chip. If the temperature or a temperature differential exceeds a respective temperature threshold or temperature differential threshold, a change to the internal power mode is triggered. In combined implementations, a start to a timer or a length of a timer (or both) can be made responsive to a temperature or a temperature differential experienced by the locked loop 130.

With reference to FIG. 5-3, after the timer 516 expires during the operational state 500-2, the internal power manager 304 triggers a change to an operational state 500-3 by changing the internal power mode signal 310 to being indicative of the internal run mode 504-1. Because the external power mode signal 306 is still indicative of the external standby mode 502-2, the internal power manager 304 is effectively overriding the external power mode signal 306 provided by the external power manager 136. Responsive to the indication of the internal run mode 504-1, the run signal generator 312 drives the run signal 224 to have the enable value 226. The enable value 226 causes the drifting to stop and starts the process of locking the loop 202. This keeps the locked state of the loop 202 from going cold. Responsive to the enable value 226 of the run signal 224, the loop 202 runs to lock the output signal 210 to the reference signal 208.

During the running of the loop 202, the loop 202 draws an active amount of current. Accordingly, the current draw graph 508 depicts a run current 510-3 for an intersection of the internal run mode 504-1 and the external standby mode 502-2 (e.g., while the external standby mode period 402-2 (of FIG. 4) persists). The run current 510-3 may have a magnitude that is at least similar to that of the normal current 510-1 (of FIG. 5-1) because the loop 202 is running in both cases. However, the run current 510-3 may be lower because at least one signal value (e.g., the output signal 210) does not need to be driven to another component. The overall current for the locked loop 130 may be greater during this operational state 500-3 as compared to that of the operational state 500-1 if additional control circuitry is operating (e.g., the locked-loop controller 204 and/or a timer 516 or a local oscillator 518 of FIG. 5-4 are operating for the operational state 500-3 but powered down for the operational state 500-1). This operational state 500-3 continues until the lock state detector 506 detects a locked state and drives an affirmative indication on the lock state indicator signal 512. The time over which the loop 202 runs to reach the locked state corresponds to the running duration 406. The internal power manager 304 receives the lock state indicator signal 512. Responsive to an affirmative indication for the lock state indicator signal 512, the internal power manager 304 changes the internal power mode signal 310 back to the internal pause mode 504-2. This action is depicted at 426 in FIG. 4. This operation also corresponds to returning the locked loop 130 to the operational state 500-2 of FIG. 5-2.

The operational states 500-2 and 500-3 can occur intermittently as long as the external power mode signal 306 indicates the external standby mode 502-2. For example, the operational states 500-2 and 500-3 can alternate between the two states or can occur periodically. Alternatively, other, intervening power modes can also occur. Further, the timing of the occurrences can vary such that the occurrences are not periodic due to changes to the timer duration 404 or the running duration 406. Regardless of the timing, an example of this intermittent occurrence of the two states is depicted in FIG. 5-4.

With reference to FIG. 5-4 and the example operational state 500-4, the internal power manager 304 is alternating between the internal pause mode 504-2 (IPM 504-2) and the internal run mode 504-1 (IRM 504-1). Thus, the internal power mode signal 310 is, over time, indicative of a series of power modes including multiple internal pause modes and multiple internal run modes. Consequently, the run signal generator 312 alternately drives the run signal 224 at the disable value 228 and the enable value 226, respectively. As depicted in the current draw graph 508, the current drawn by the loop 202 fluctuates between the standby current 510-2 and the run current 510-3 (which may be at least close to a magnitude of the normal current 510-1) with a timing that tracks the changes of the values provided on the run signal 224. Thus, the loop 202 exhibits repetitive current spike events 514 as the loop 202 repetitively draws a current with an increased magnitude while running in a feedback mode to repeatedly return the loop 202 to a substantially locked state during the external standby mode 502-2. The width or duration of each current spike event 514 depends on how much time transpires while the loop 202 runs to achieve a locked state each time the loop 202 is spun up.

Figure 6:
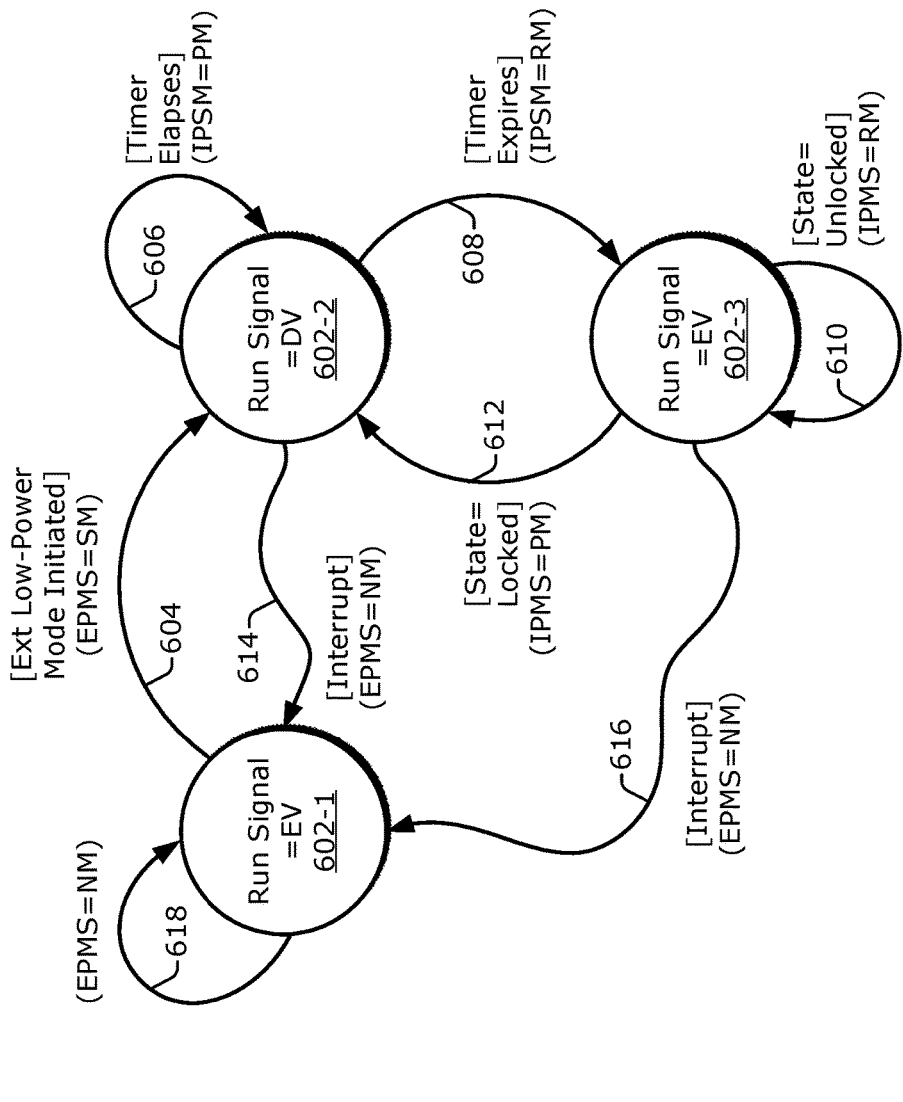
FIG. 6 illustrates an example state machine for a locked-loop controller of a locked loop.

FIG. 6 illustrates an example state machine 600 for a locked-loop controller 204 of a locked loop 130. The state machine includes three states 602-1, 602-2, and 602-3. These three states 602-1, 602-2, and 602-3 of the locked-loop controller 204 respectively correspond to the three operational states 500-1, 500-2, and 500-3 of the locked loop 130 across FIGS. 5-1, 5-2, and 5-3. Thus, the state 602-1 exists when the run signal 224 is driven at the enable value (EV) responsive to the external power mode signal 306 being indicative of the external normal mode 502-1. The state 602-2 exists when the run signal 224 is driven at the disable value (DV) responsive to the external power mode signal 306 being indicative of the external standby mode 502-2 and responsive to the internal power mode signal 310 being indicative of the internal pause mode 504-2 (e.g., a phase in which the internal power manager 304 adheres to the external power mode signal 306). The state 602-3 exists when the run signal 224 is driven at the enable value (EV) responsive to the external power mode signal 306 being indicative of the external standby mode 502-2 and responsive to the internal power mode signal 310 being indicative of the internal run mode 504-1 (e.g., a phase in which the internal power manager 304 overrides the external power mode signal 306).

For the state 602-1, the run signal 224 has the enable value (EV), and the loop 202 is running. As indicated by an arrow 618, the locked-loop controller 204 remains in the state 602-1 in which the loop 202 is running as long as the external power mode signal 306 (EPMS) indicates the normal mode (NM). As indicated by an arrow 604, a transition to the state 602-2 is triggered by the external power mode signal 306 becoming indicative of the standby mode (SM), such as if an external low-power mode is initiated. With the states 602-2 and 602-3, the states are instituted by the internal power mode signal 310 (IPMS).

For the state 602-2, the run signal 224 has the disable value (DV), and the loop 202 is not running. As indicated by an arrow 606, the locked-loop controller 204 remains in the state 602-2 in which the loop 202 is not running as long as the internal power mode signal 310 indicates the pause mode (PM). This continues while the timer 516 (of FIG. 5-2) elapses. Upon expiration of the timer 516, the internal power manager 304 changes the internal power mode signal 310 to the run mode (RM) to spin up the loop 202 as indicated by an arrow 608. This arrow 608 indicates that the locked-loop controller 204 transitions from the state 602-2 to the state 602-3.

For the state 602-3, the run signal generator 312 generates the run signal 224 to have the enable value (EV). Thus, the loop 202 is spun up again to lock the output signal 210 to the reference signal 208 (or to run toward locking for some time period) while external components remain in a low-powered standby mode. As indicated by an arrow 610, the locked-loop controller 204 remains in the state 602-3 in which the loop 202 is running as long as the internal power mode signal 310 indicates the run mode (RM) because the loop state is still unlocked. As indicated by an arrow 612, a transition back to the state 602-2 is triggered responsive to the loop 202 entering the locked state, as determined by the lock state detector 506. Responsive to the locked state being detected, the internal power manager 304 returns the internal power mode signal 310 to being indicative of the pause mode (PM).

The locked-loop controller 204 can switch between at least the two states 602-2 and 602-3 until the external power manager 136 changes the external power mode signal 306 to being indicative of the normal mode to awaken multiple components on a system level. In such a case, the locked-loop controller 204 responds to this change as an interrupt to the internal power management processes as indicated by arrows 614 and 616. If the locked-loop controller 204 is in the state 602-2 when an interrupt occurs, the locked-loop controller 204 transitions to the state 602-1 as indicated by the arrow 614. To do so, the internal power manager 304 produces the internal power mode signal 310 with a run mode (RM) indication and the loop 202 can be spun up in a regular manner.

If, on the other hand, the locked-loop controller 204 is in the state 602-3 when an interrupt occurs, the locked-loop controller 204 transitions to the state 602-1 as indicated by the arrow 616. To do so, the internal power manager 304 produces the internal power mode signal 310 with a run mode (RM) indication. Further, if the locked-loop controller 204 is operating in the state 602-3 when the interrupt is caused by the external power manager 136, the loop 202 is currently running and attempting to reach a locked state when the external power mode signal 306 changes from the standby mode (SM) to the normal mode (NM). Consequently, the memory state 222 of the memory state component 214 can be in flux. At least for a digital implementation of the loop 202, the locked-loop controller 204 can reinstate a previous version of the memory state 222, such as a most-recent previous version. To do so, the loop 202 can store a previous memory state 222 (e.g., a digital value in a register) at least until a new memory state 222 is determined. If the interrupt occurs while the locked-loop controller 204 is in the state 602-3, the locked-loop controller 204 retrieves the previous memory state 222 from storage and loads this previous value into the memory state component 214 for initial use with the state 602-1.

Figure 7:
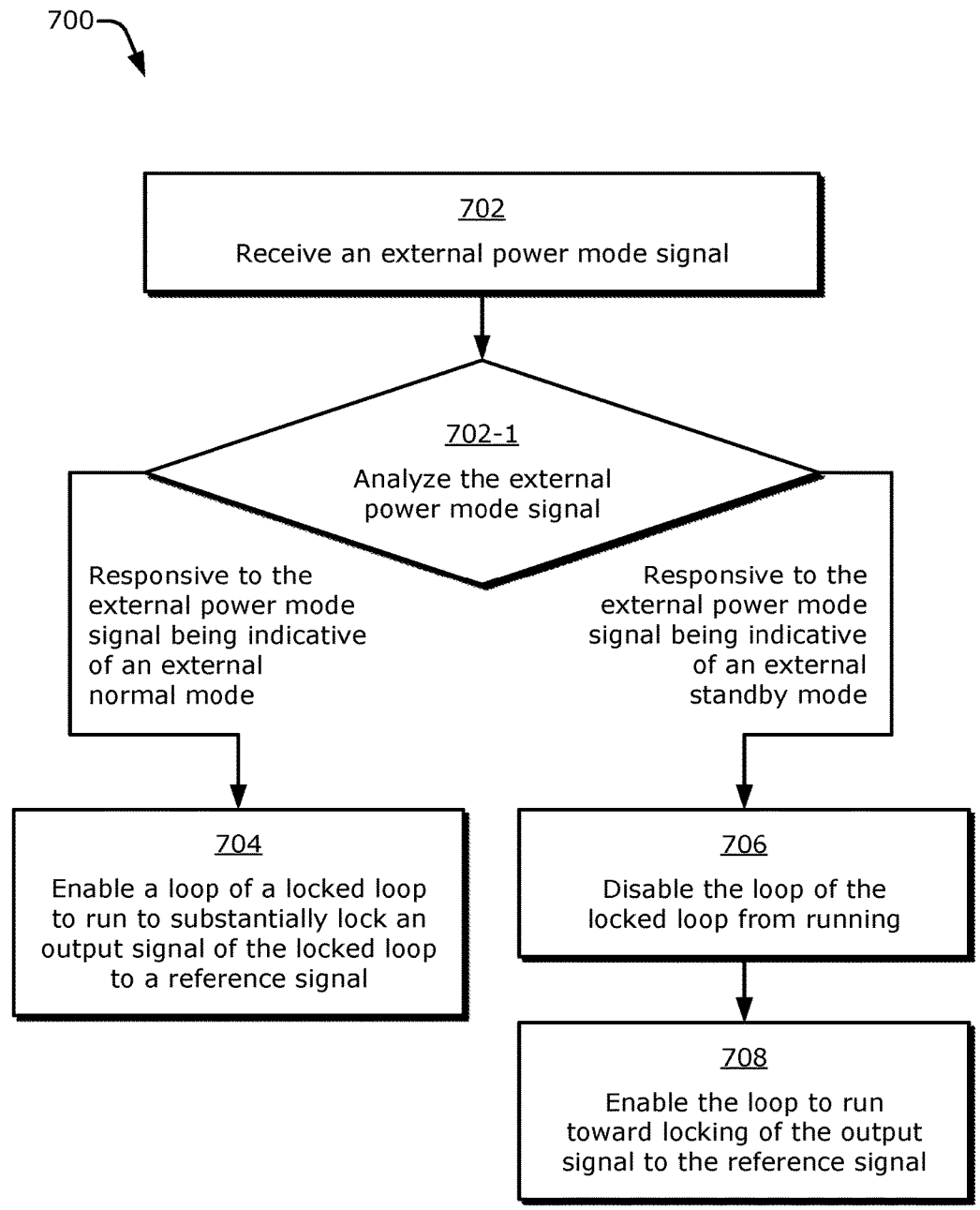
FIG. 7 is a flow diagram illustrating an example process for relocking for locked loops.

FIG. 7 is a flow diagram illustrating an example process 700 for relocking for locked loops. The process 700 is described in the form of a set of blocks 702-708 that specify operations that can be performed. However, operations are not necessarily limited to the order shown in FIG. 7 or described herein, for the operations may be implemented in alternative orders or in fully or partially overlapping manners. Also, fewer, more, and/or different operations may be implemented to perform the process 700, or an alternative process. Operations represented by the illustrated blocks of the process 700 may be performed by a locked loop 130, such as at least partially by a locked-loop controller 204 thereof. More specifically, the operations of the process 700 may be performed by an internal power manager 304 and a run signal generator 312.

At block 702, an external power mode signal is received. For example, a locked-loop controller 204 of a locked loop 130 can receive an external power mode signal 306. For instance, an internal power manager 304 may receive the external power mode signal 306 from an external power manager 136. At block 702-1, the external power mode signal is analyzed. For example, the locked-loop controller 204 can analyze the external power mode signal 306 to determine what type of external power mode is being indicated.

Based on the analysis of block 702-1, the operation(s) of the block 704 are performed responsive to the external power mode signal 306 being indicative of an external normal mode 502-1. At block 704, a loop of the locked loop is enabled to run to substantially lock an output signal of the locked loop to a reference signal. For example, the locked-loop controller 204 can enable the loop 202 of the locked loop 130 to run to substantially lock (e.g., to lock to at least some locking threshold) an output signal 210 of the locked loop 130 to a reference signal 208. In some implementations, a run signal generator 312 may generate a run signal 224 having an enable value 226 that is further responsive to an internal power mode signal 310 being indicative of an internal run mode 504-1 (e.g., as shown in FIG. 5-1). After the loop 202 is substantially locked to the reference signal 208, the loop 202 may continue to run such that the output signal 210 continues to be output, for example as long as the external power mode signal 306 continues being indicative of the external normal mode 502-1.

On the other hand, based on the analysis of block 702-1, the operations of the blocks 706 and 708 are performed responsive to the external power mode signal 306 being indicative of an external standby mode 502-2. At block 706, the loop of the locked loop is disabled from running. For example, the locked-loop controller 204 can disable the loop 202 from running to save power during the external standby mode 502-2. To do so, the run signal generator 312 may generate a run signal 224 having a disable value 228 that is further responsive to the internal power mode signal 310 being indicative of an internal pause mode 504-2 (e.g., as shown in FIG. 5-2).

At block 708, the loop is enabled to run toward locking of the output signal to the reference signal. For example, the locked-loop controller 204 can enable the loop 202 to run toward locking of the output signal 210 to the reference signal 208 to keep the loop warm during an external standby mode period 402-2. For instance, the run signal generator 312 may generate a run signal 224 having an enable value 226 that is further responsive to the internal power mode signal 310 being indicative of an internal run mode 504-1. This internal indication and/or the enable value 226 for the run signal 224 serves to override the external standby mode 502-2 (e.g., as shown in FIG. 5-3). In some implementations, the loop 202 is permitted to run toward locking until a locked state is substantially reached, which can be determined by a lock state determiner 506. The lock state determiner 506 may use a same locking threshold as for an external normal mode 502-1 or may use a different (e.g., more relaxed) locking threshold. In other implementations, the loop 202 is permitted to run toward locking until a timer expires.

In example operations, the process may further include switching repeatedly between the disabling of block 706 and the enabling of block 708 until the received external power mode signal 306 is indicative again of an external normal mode 502-1 (e.g., as determinable at the analysis of block 702-1). For example, the locked-loop controller 204 can switch between at least disabling the loop 202 from running and enabling the loop 202 from running using the run signal 224. The switching may include switching from the disabling of the loop 202 to the enabling of the loop 202 based on a trigger. Examples of triggers include expiration of the timer 516 (e.g., as shown in FIG. 5-4) for a timer duration 404, detection of a temperature obtained via a temperature sensor, some combination thereof, and so forth. Further, the switching may include switching from the enabling of the loop 202 to the disabling of the loop 202 based on a lock state of the loop 202 as represented by the lock state indicator signal 512, based on an expiration of a timer (e.g., by using the timer 516 to set a running duration 406), some combination thereof (e.g., running is paused at a first occurrence of reaching a locked state or a timer expiring), and so forth.

Figure 8:
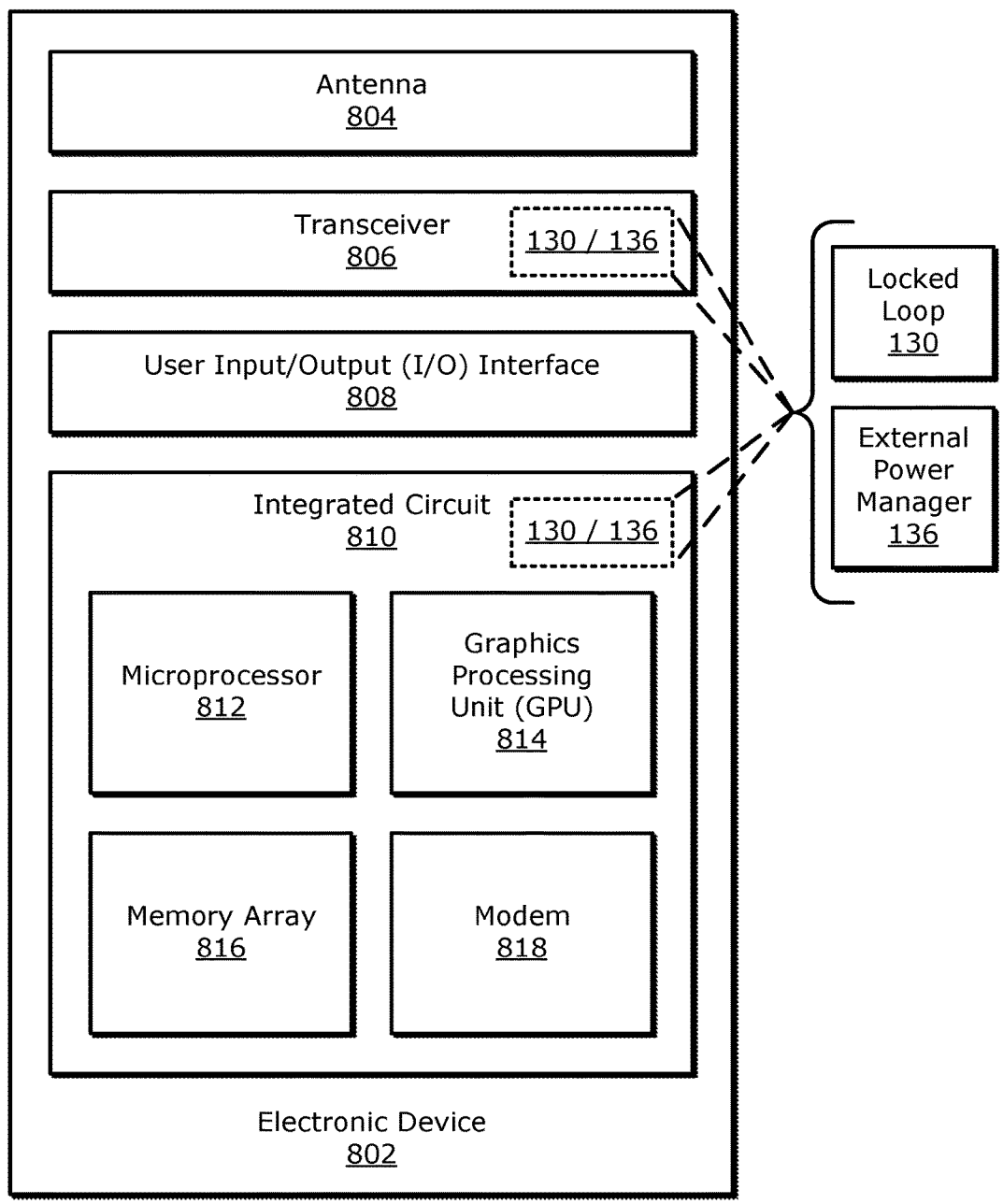
FIG. 8 illustrates an example electronic device that includes one or more components in which relocking for locked loops can be implemented.

FIG. 8 illustrates an example electronic device 802 that includes an integrated circuit 810 (IC) having multiple cores. The electronic device 802 includes one or more components in which systems and methods for relocking for locked loops can be implemented. As shown, the electronic device 802 includes an antenna 804, a transceiver 806, and a user input/output (I/O) interface 808, in addition to the integrated circuit 810. Illustrated examples of the integrated circuit 810, or cores thereof, include a microprocessor 812, a graphics processing unit (GPU) 814, a memory array 816, and a modem 818. In one or more example implementations, a locked loop 130 and an external power manager 136 as described herein can be implemented by the transceiver 806, by the integrated circuit 810, and so forth such that a relocking duration can be reduced and/or an accuracy can be increased for locked loops that participate in power management scenarios.

The electronic device 802 can be a mobile or battery-powered device or a fixed device that is designed to be powered by an electrical grid. Examples of the electronic device 802 include a server computer, a network switch or router, a blade of a data center, a personal computer, a desktop computer, a notebook or laptop computer, a tablet computer, a smart phone, an entertainment appliance, or a wearable computing device such as a smartwatch, intelligent glasses, or an article of clothing. An electronic device 802 can also be a device, or a portion thereof, having embedded electronics. Examples of the electronic device 802 with embedded electronics include a passenger vehicle, wireless charging equipment, industrial equipment, a refrigerator or other home appliance, a drone or other unmanned aerial vehicle (UAV), or a power tool.

For an electronic device with a wireless capability, the electronic device 802 includes an antenna 804 that is coupled to a transceiver 806 to enable reception or transmission of one or more wireless signals. The integrated circuit 810 may be coupled to the transceiver 806 to enable the integrated circuit 810 to have access to received wireless signals or to provide wireless signals for transmission via the antenna 804. The electronic device 802 as shown also includes at least one user I/O interface 808. Examples of the user I/O interface 808 include a keyboard, a mouse, a microphone, a touch-sensitive screen, a camera, an accelerometer, a haptic mechanism, a speaker, a display screen, or a projector. The transceiver 806 can correspond to, for instance, the wireless transceiver 120 (of FIG. 1) that implements a locked loop 130 as described herein.

The integrated circuit 810 may comprise, for example, one or more instances of a microprocessor 812, a GPU 814, a memory array 816, a modem 818, and so forth. The microprocessor 812 may function as a central processing unit (CPU) or other general-purpose processor. Some microprocessors include different parts, such as multiple processing cores, that may be individually powered on or off. The GPU 814 may be especially adapted to process visual-related data for display, such as video data images. If visual-related data is not being rendered or otherwise processed, the GPU 814 may be fully or partially powered down. The memory array 816 stores data for the microprocessor 812 or the GPU 814. Example types of memory for the memory array 816 include random access memory (RAM), such as dynamic RAM (DRAM) or static RAM (SRAM); flash memory; and so forth. If programs are not accessing data stored in memory, the memory array 816 may be powered down overall or block-by-block. The modem 818 demodulates a signal to extract encoded information or modulates a signal to encode information into the signal. If there is no information to decode from an inbound communication or to encode for an outbound communication, the modem 818 may be idled to reduce power consumption. The integrated circuit 810 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 810 may also comprise a system-on-chip (SoC). An SoC may integrate a sufficient number of different types of components to enable the SoC to provide computational functionality as a notebook computer, a mobile phone, or another electronic apparatus using one chip, at least primarily. Components of an SoC, or an integrated circuit 810 generally, may be termed cores or circuit blocks. Examples of cores or circuit blocks include, in addition to those that are illustrated in FIG. 8, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or circuit blocks, such as a central processing unit or a multimedia processor, may further include multiple internal cores or circuit blocks.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
    a locked loop including:
        a loop configured to run responsive to a run signal, the loop including:
            a memory state component; and
            signal characteristic adjustment circuitry coupled to the memory state component, the signal characteristic adjustment circuitry configured to produce an output signal having a characteristic that is based on the memory state component; and
        a locked-loop controller coupled to the loop, the locked-loop controller configured to:
            receive an external power mode signal;
            generate the run signal to have an enable value at a first time when the external power mode signal is indicative of an external normal mode; and
            generate the run signal to have the enable value at a second time when the external power mode signal is indicative of an external standby mode.

2. The apparatus of claim 1, wherein the locked-loop controller is configured, while the external power mode signal is indicative of the external standby mode, to:
    cause the loop to run to substantially lock to a reference signal at the second time during an external standby mode period; and
    cause the loop to cease running at a third time during the external standby mode period.

3. The apparatus of claim 1, further comprising:
    an external power manager configured to:
        provide the external power mode signal to the locked loop and to a device component separate from the locked loop; and
        drive the external power mode signal to indicate the external standby mode and the external normal mode.

4. The apparatus of claim 3, wherein the locked-loop controller is configured to generate the run signal to have an enable value responsive to the external power mode signal being changed from the external standby mode to the external normal mode.

5. The apparatus of claim 3, wherein the locked-loop controller is configured to generate the run signal to have a disable value at a third time when the external power mode signal is indicative of the external standby mode.

6. The apparatus of claim 5, wherein:
    the locked-loop controller includes an internal power manager;
    the internal power manager includes a timer; and
    the internal power manager is configured to, responsive to the external power mode signal being indicative of the external standby mode, cycle at least between providing the run signal with the enable value and providing the run signal with the disable value based on the timer.

7. The apparatus of claim 1, wherein the locked-loop controller is configured to override the external power mode signal by enabling the loop to run and update the memory state component during the external standby mode.

8. The apparatus of claim 7, wherein:
    the memory state component comprises an accumulator that is configured to have a memory state, and the accumulator is configured to store a digital value as the memory state; or
    the memory state component comprises a capacitor that is configured to have a memory state, and the capacitor is configured to store a voltage differential as the memory state.

9. The apparatus of claim 1, wherein the locked loop is configured to gate one or more signals from external circuitry at least during the external standby mode.

10. The apparatus of claim 1, wherein:
the locked loop comprises a frequency locked loop (FLL);
the output signal has a frequency; and
the signal characteristic adjustment circuitry comprises a variable oscillator configured to adjust the frequency of the output signal based on the memory state component.

11. The apparatus of claim 1, wherein:
the locked loop comprises a phase locked loop (PLL);
the output signal has a phase; and
the signal characteristic adjustment circuitry comprises a variable oscillator configured to adjust the phase of the output signal based on the memory state component.

12. The apparatus of claim 1, wherein:
the locked loop comprises a delay locked loop (DLL);
the output signal is associated with a delay; and
the signal characteristic adjustment circuitry comprises a variable delay circuit configured to adjust the delay associated with the output signal based on the memory state component.

13. The apparatus of claim 1, wherein the locked-loop controller includes an internal power manager configured to generate an internal power mode signal, the internal power mode signal indicative of a series of power modes over time including multiple internal pause modes and multiple internal run modes.

14. The apparatus of claim 13, wherein the locked-loop controller is configured to enable the loop to run responsive to the external power mode signal being indicative of an external normal mode regardless of a power mode indicated by the internal power mode signal.

15. The apparatus of claim 13, wherein the locked-loop controller is configured to enable the loop to run responsive to the external power mode signal being indicative of the external standby mode and to the internal power mode signal being indicative of an internal run mode of the multiple internal run modes.

16. The apparatus of claim 13, wherein the locked-loop controller is configured to disable the loop from running responsive to the external power mode signal being indicative of the external standby mode and to the internal power mode signal being indicative of an internal pause mode of the multiple internal pause modes.

17. The apparatus of claim 13, wherein each internal run mode of the multiple internal run modes has a duration that is sufficient to enable the loop to substantially lock the output signal to a reference signal after a memory state of the memory state component drifts during an internal pause mode of the multiple internal pause modes.

18. The apparatus of claim 1, wherein the locked-loop controller is configured to cause repetitive current spike events by the locked loop while the external power mode signal is indicative of the external standby mode.

19. The apparatus of claim 18, wherein the loop is configured to exhibit the current spike events as the loop repetitively draws a current with an increased magnitude while running in a feedback mode to repeatedly return the loop to a substantially locked state during the external standby mode.

20. The apparatus of claim 1, wherein the locked-loop controller is configured to keep the loop warm during the external standby mode to reduce a relocking duration that elapses after the external standby mode is terminated relative to a relocking duration for a cold loop.

21. The apparatus of claim 1, further comprising a sensor, wherein:
the locked-loop controller includes an internal power manager; and
the internal power manager is configured to, responsive to the external power mode signal being indicative of the external standby mode, cycle at least between providing the run signal with the enable value and providing the run signal with a disable value based on information from the sensor.

22. A system comprising:
a locked loop including:
a loop configured to provide an output signal responsive to a run signal; and
control means for periodically keeping the loop warm responsive to an external power mode signal being indicative of an external standby mode, the control means configured to provide the run signal to the loop.

23. The system of claim 22, wherein:
the system comprises a wireless transceiver; and
the locked loop comprises a frequency locked loop (FLL).

24. The system of claim 22, wherein the control means comprises power mode means for establishing for the loop a series of power modes including multiple internal pause modes and multiple internal run modes while the external power mode signal is indicative of the external standby mode.

25. The system of claim 22, wherein the control means is configured to spin up the loop to update the memory state by locking the output signal to a reference signal to account for drift that occurs during a time period in which the external power mode signal is indicative of the external standby mode.

26. A method for operating a locked loop, the method comprising:
receiving an external power mode signal;
responsive to the external power mode signal being indicative of an external normal mode, enabling a loop of the locked loop to run to substantially lock an output signal of the locked loop to a reference signal; and
responsive to the external power mode signal being indicative of an external standby mode,
disabling the loop of the locked loop from running; and
enabling the loop to run toward locking of the output signal to the reference signal.

27. The method of claim 26, wherein:
the disabling comprises generating a run signal to have a disable value;
the enabling comprises generating the run signal to have an enable value; and
the method further comprises switching from the disabling to the enabling based on a trigger.

28. The method of claim 26, further comprising:
overriding the external power mode signal being indicative of the external standby mode, the overriding including establishing an internal run mode,
wherein the enabling is performed responsive to the establishing of the internal run mode.

29. The method of claim 26, wherein the enabling comprises:
running the loop in a feedback mode to adjust a characteristic of the output signal; and
updating a memory state of a memory state component to lock the output signal to the reference signal based on the running.

30. The method of claim 26, further comprising:
  switching from the enabling to the disabling based on at least one of an expiration of a timer or an attainment of a substantially locked state.

* * * * *